(12) United States Patent
Nakano et al.

(10) Patent No.: US 9,911,818 B2
(45) Date of Patent: *Mar. 6, 2018

(54) SEMICONDUCTOR DEVICE

(71) Applicant: ROHM CO., LTD., Kyoto (JP)

(72) Inventors: Yuki Nakano, Kyoto (JP); Ryota Nakamura, Kyoto (JP); Katsuhisa Nagao, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/428,819

(22) Filed: Feb. 9, 2017

(65) Prior Publication Data

US 2017/0154971 A1 Jun. 1, 2017

Related U.S. Application Data

(63) Continuation of application No. 14/958,867, filed on Dec. 3, 2015, now Pat. No. 9,601,582, which is a
(Continued)

(30) Foreign Application Priority Data

Jul. 21, 2009 (JP) ................... 2009-170154
Oct. 7, 2009 (JP) ................... 2009-233777
Jul. 2, 2010 (JP) ................... 2010-152085

(51) Int. Cl.
| | |
|---|---|
| *H01L 21/3205* | (2006.01) |
| *H01L 29/423* | (2006.01) |
| *H01L 21/04* | (2006.01) |
| *H01L 29/04* | (2006.01) |
| *H01L 29/16* | (2006.01) |
| *H01L 29/66* | (2006.01) |
| *H01L 29/786* | (2006.01) |
| *H01L 29/49* | (2006.01) |
| *H01L 29/78* | (2006.01) |
| *H01L 29/10* | (2006.01) |
| *H01L 29/167* | (2006.01) |

(52) U.S. Cl.
CPC ........ *H01L 29/4236* (2013.01); *H01L 21/046* (2013.01); *H01L 21/049* (2013.01); *H01L 29/045* (2013.01); *H01L 29/1095* (2013.01); *H01L 29/167* (2013.01); *H01L 29/1608* (2013.01); *H01L 29/4916* (2013.01);
(Continued)

(58) Field of Classification Search
CPC ............... H01L 29/1095; H01L 21/049; H01L 29/7813; H01L 29/4925; H01L 29/4916; H01L 29/78684; H01L 29/66068; H01L 29/1608; H01L 29/045; H01L 21/046
See application file for complete search history.

(56) References Cited

U.S. PATENT DOCUMENTS

| | | |
|---|---|---|
| 6,057,558 A | 5/2000 | Yamamoto et al. |
| 6,342,709 B1 | 1/2002 | Sugawara et al. |

(Continued)

FOREIGN PATENT DOCUMENTS

| | | |
|---|---|---|
| JP | H09-321323 A | 12/1997 |
| JP | H10-308512 A | 11/1998 |

(Continued)

*Primary Examiner* — Jack Chen
(74) *Attorney, Agent, or Firm* — Rabin & Berdo, P.C.

(57) ABSTRACT

A semiconductor device includes a semiconductor region made of a material to which conductive impurities are added, an insulating film formed on a surface of the semiconductor region, and an electroconductive gate electrode formed on the insulating film. The gate electrode is made of a material whose Fermi level is closer to a Fermi level of the semiconductor region than a Fermi level of Si in at least a portion contiguous to the insulating film.

15 Claims, 19 Drawing Sheets

Related U.S. Application Data continuation of application No. 14/030,765, filed on Sep. 18, 2013, now Pat. No. 9,224,825, which is a continuation of application No. 13/774,549, filed on Feb. 22, 2013, now Pat. No. 8,563,981, which is a continuation of application No. 12/839,983, filed on Jul. 20, 2010, now Pat. No. 8,395,162.

(52) U.S. Cl.
CPC .... *H01L 29/4925* (2013.01); *H01L 29/66068* (2013.01); *H01L 29/7813* (2013.01); *H01L 29/78684* (2013.01)

(56) References Cited

U.S. PATENT DOCUMENTS

| | | | |
|---|---|---|---|
| 8,395,162 B2* | 3/2013 | Nakano | H01L 21/046 257/49 |
| 8,563,981 B2* | 10/2013 | Nakano | H01L 21/046 257/192 |
| 9,224,825 B2* | 12/2015 | Nakano | H01L 21/046 |
| 9,601,582 B2* | 3/2017 | Nakano | H01L 21/046 |
| 2005/0012143 A1 | 1/2005 | Tanaka et al. | |
| 2006/0180077 A1 | 8/2006 | Suda et al. | |
| 2006/0220158 A1 | 10/2006 | Takizawa | |
| 2007/0057262 A1 | 3/2007 | Nakamura et al. | |
| 2007/0187695 A1 | 8/2007 | Nakamura et al. | |
| 2008/0210988 A1 | 9/2008 | Twynam | |
| 2009/0173997 A1 | 7/2009 | Fujihira et al. | |
| 2010/0006861 A1 | 1/2010 | Yamamoto et al. | |
| 2010/0019250 A1 | 1/2010 | Nakamura et al. | |
| 2010/0075474 A1 | 3/2010 | Kudou et al. | |
| 2011/0017998 A1 | 1/2011 | Nakano et al. | |

FOREIGN PATENT DOCUMENTS

| | | |
|---|---|---|
| JP | 2005/019494 A | 1/2005 |
| JP | 2005/303010 A | 10/2005 |
| JP | 2007/066959 A | 3/2007 |
| JP | 2007/194283 A | 8/2007 |
| JP | 2008/124374 A | 5/2008 |
| JP | 2009/130069 A | 6/2009 |

* cited by examiner

FIG. 8
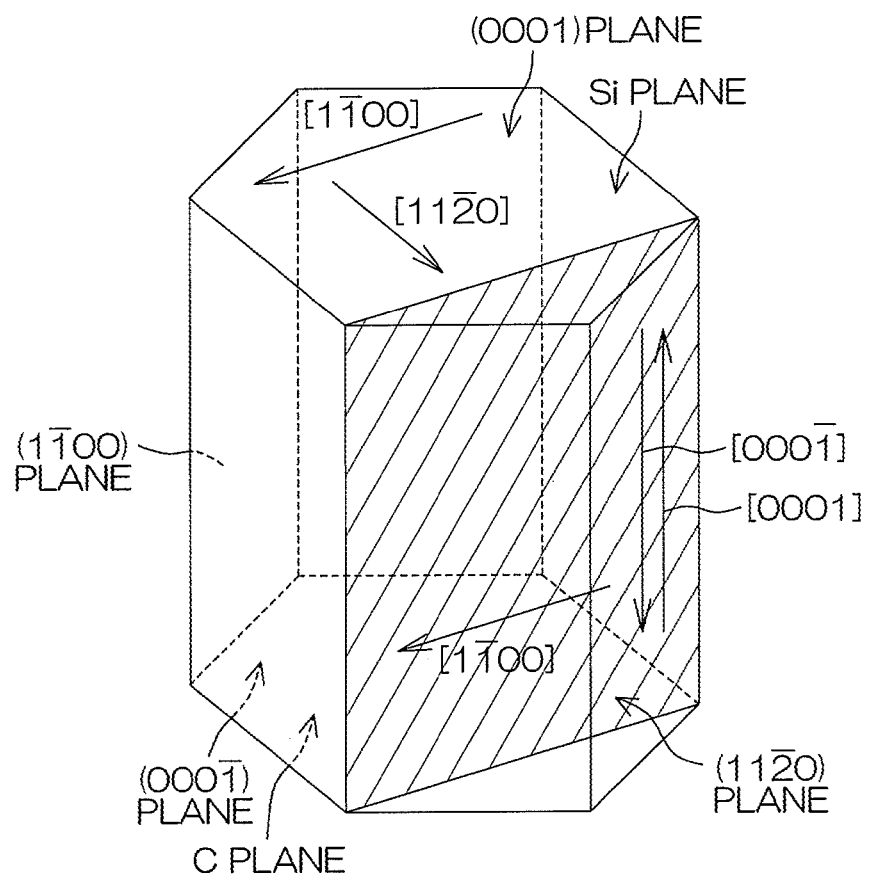
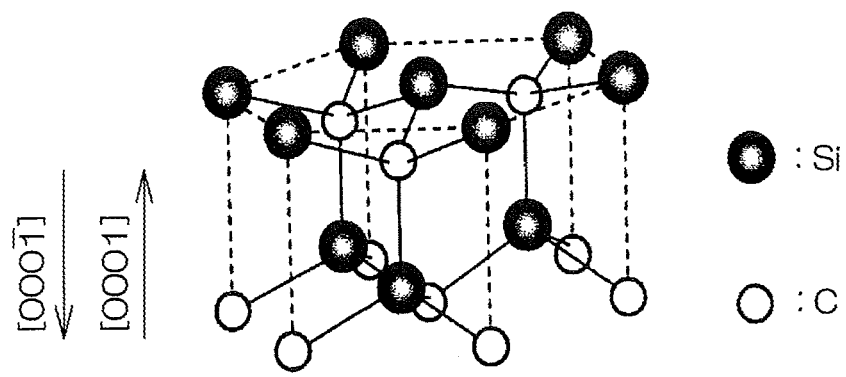

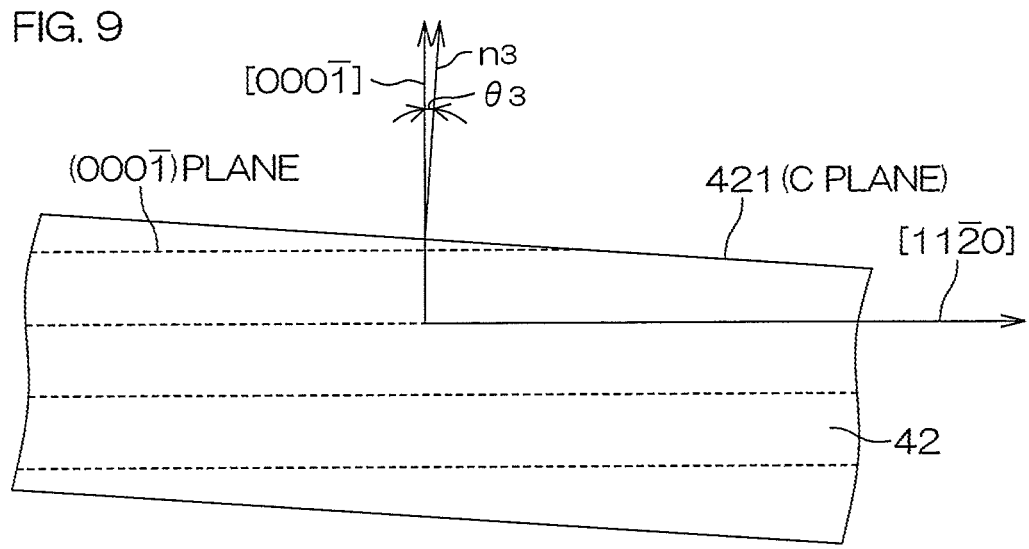

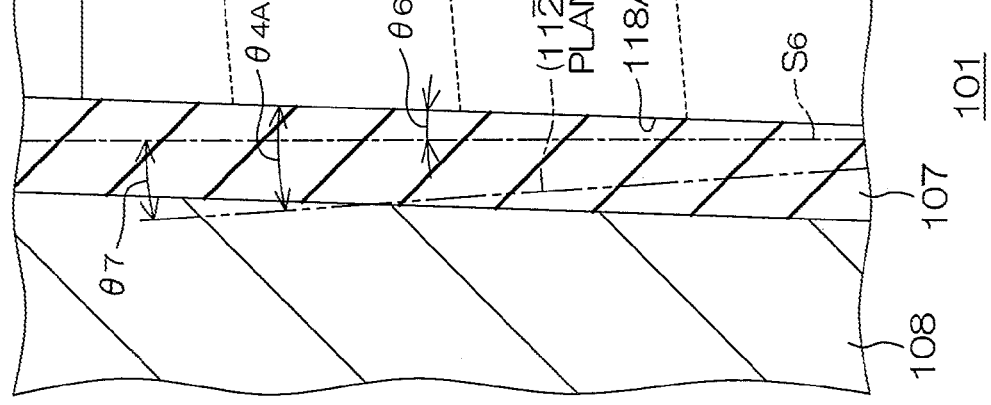
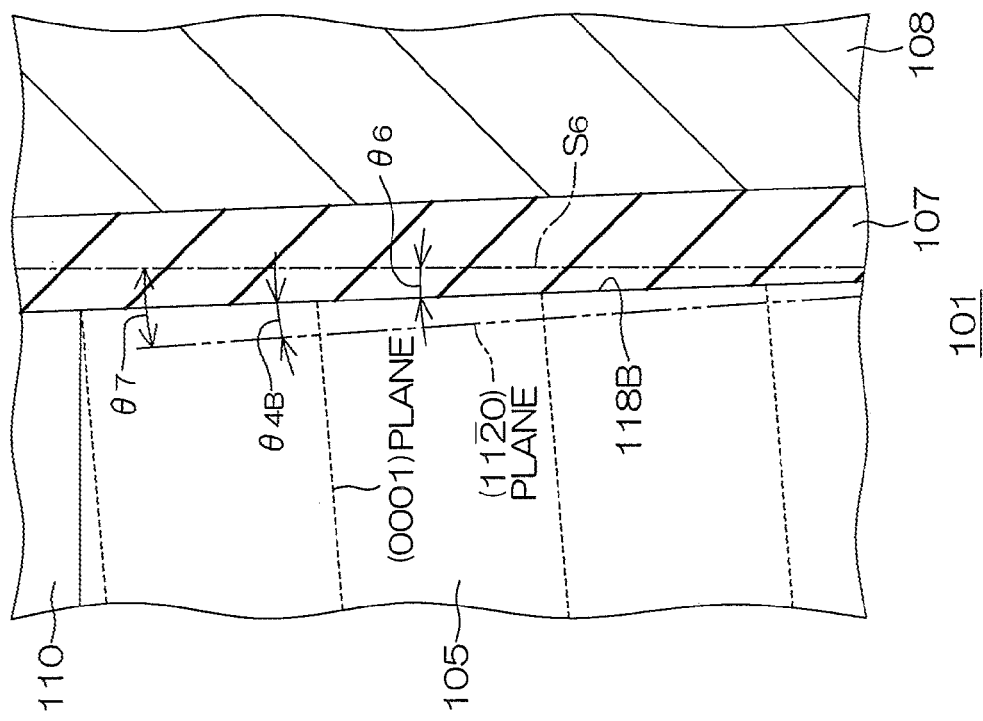

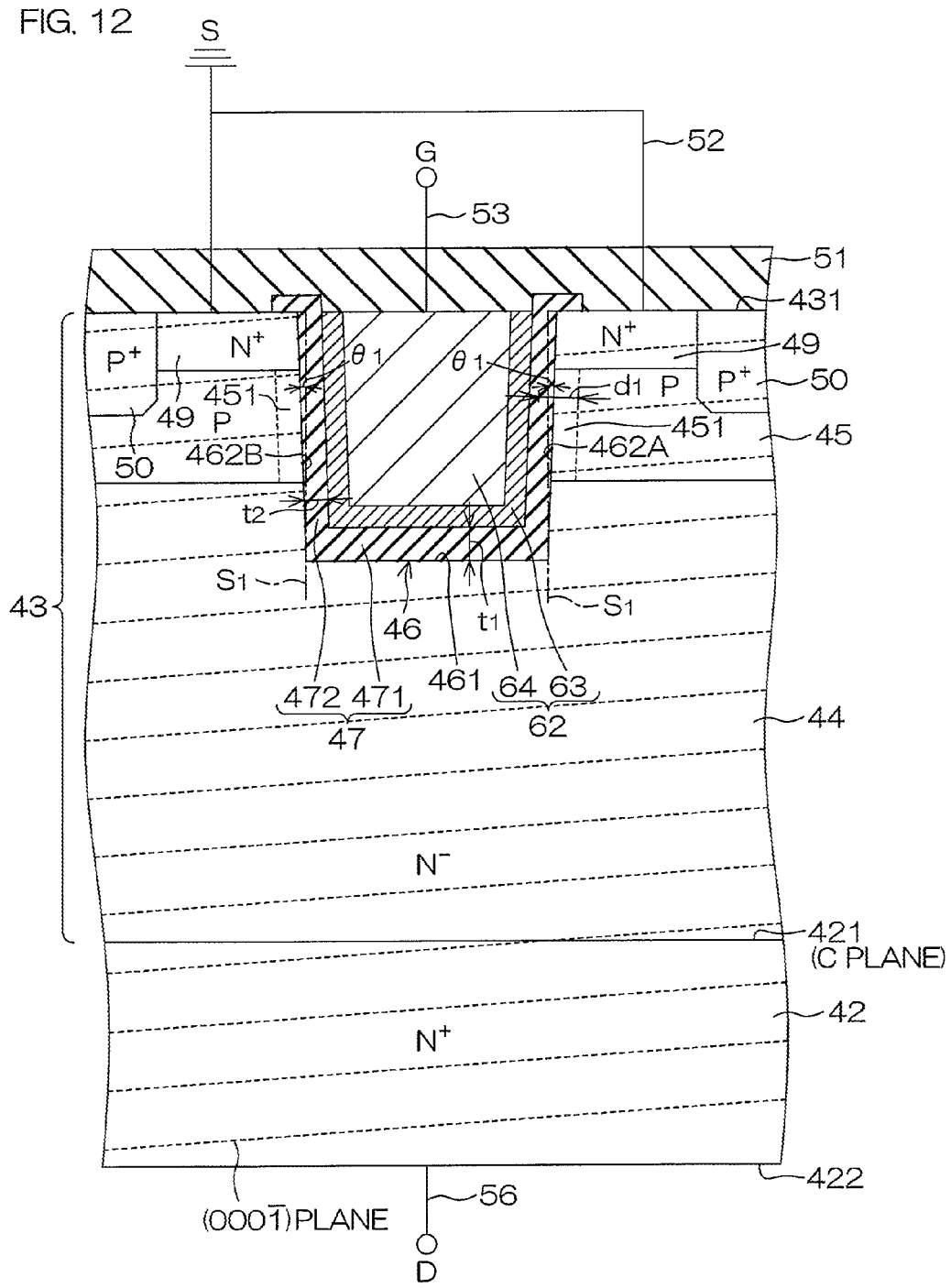

SEMICONDUCTOR DEVICE

This application is a continuation of co-pending application Ser. No. 14/958,867, filed on Dec. 3, 2015, which is a continuation of application Ser. No. 14/030,765, filed on Sep. 18, 2013, now U.S. Pat. No. 9,224,825, which is a continuation of application Ser. No. 13/774,549, filed on Feb. 22, 2013, now U.S. Pat. No. 8,563,981, which is a continuation of application Ser. No. 12/839,983, filed on Jul. 20, 2010, now U.S. Pat. No. 8,395,162. Furthermore, this application claims the benefit of priority of Japanese applications 2009-170154, 2009-233777 and 2010-152085, filed on Jul. 21, 2009, Oct. 7, 2009 and Jul. 2, 2010 respectively. The disclosures of these prior U.S. and Japanese applications are incorporated herein by reference.

BACKGROUND OF THE INVENTION

Field of the Invention

The present invention relates to a semiconductor device that includes a MISFET (Metal Insulator Semiconductor Field Effect Transistor).

Description of Related Art

For example, a SiC (silicon carbide) semiconductor is excellent in dielectric breakdown resistance, thermal conductivity, etc., and therefore has been receiving attention as a semiconductor suitable to be used in, for example, an inverter of a hybrid vehicle.

FIG. 19 is a schematic sectional view of a conventional SiC semiconductor device.

A SiC semiconductor device 101 includes an $N^+$-type 4H—SiC substrate 102 that serves as a foundation of the SiC semiconductor device 101. The SiC substrate 102 is made of SiC monocrystal, and is a substrate having an off-angle at which a surface 121, which is a Si surface defined as a principal plane on whose outermost surface Si atoms appear, is inclined in the direction of a [11-20] axis with respect to a (0001) plane. In FIG. 19, the (0001) plane in the SiC semiconductor device 101 is shown by the broken line.

An $N^-$-type epitaxial layer 103 made of SiC doped with a lower concentration of N-type impurities than the SiC substrate 102 is stacked on the surface 121 of the SiC substrate 102. The epitaxial layer 103 is made of SiC that grows from the surface 121 of the SiC substrate 102, and has a principal plane (i.e., surface 117) parallel to the surface 121.

A base portion of the epitaxial layer 103 serves as an $N^-$-type drain region 104 being in a constant state without being changed after the epitaxial growth. The epitaxial layer 103 has a P-type body region 105 formed on the drain region 104 contiguously with the drain region 104.

Additionally, the epitaxial layer 103 has a gate trench 106 formed by being dug downwardly from the surface 117. The gate trench 106 penetrates the body region 105 in the layer thickness direction, and its deepest portion (i.e., bottom surface 116) reaches the drain region 104. The gate trench 106 is formed in a tapered manner such that the distance between a side surface 118A and a side surface 118B that face each other becomes narrower in proportion to progress in the depth direction and such that the side surfaces 118A and 118B are inclined at taper angle $\theta_6$ with respect to a virtual surface $S_6$ perpendicular to the surface 117 of the epitaxial layer 103.

A gate insulating film 107 made of $SiO_2$ is formed in the gate trench 106 so as to cover the whole of the inner surface of the gate trench 106.

The inside of the gate insulating film 107 is filled with polysilicon material (N-type Poly-Si) doped with N-type impurities, and, as a result, a gate electrode 108 is embedded in the gate trench 106.

An $N^+$-type source region 109 is formed at a surface portion of the epitaxial layer 103 on both sides in a direction (rightward-leftward direction in FIG. 19) perpendicular to the gate width with respect to the gate trench 106. The epitaxial layer 103 additionally has a $P^+$-type body contact region 110 that penetrates a center portion of the source region 109 in the direction perpendicular to the gate width from the surface 117 and that is connected to the body region 105.

An interlayer insulating film 111 made of $SiO_2$ is stacked on the epitaxial layer 103. Via a contact hole (not shown) formed in the interlayer insulating film 111, a source wiring 112 is connected to the source region 109, and a gate wiring 113 is connected to the gate electrode 108.

A drain wiring 115 is connected to a back surface 118 opposite to the surface 121 of the SiC substrate 102.

When a voltage exceeding a threshold value is applied to the gate electrode 108 in a state in which the source wiring 112 is grounded and in which a positive voltage is applied to the drain wiring 115, a channel is formed near an interface with the gate insulating film 107 in the body region 105, and an electric current flows between the source wiring 112 and the drain wiring 115.

SUMMARY OF THE INVENTION

In order to improve the channel mobility of MISFET (i.e., in order to reduce the channel resistance), it is recommended to lower the P-type impurity concentration near the surface of a body region in which a channel is formed. However, for example, if the P-type impurity concentration near the surface of the body region 105 is lowered in the SiC semiconductor device 101, the threshold voltage will fall, and therefore an off-leakage current flowing between the source wiring 112 and the drain wiring 115 is increased in a state in which the SiC semiconductor device 101 is in an off state (i.e., gate voltage=0 V).

In order to raise the threshold voltage, it is conceivable that the material of the gate electrode 108 is changed from N-type Poly-Si to P-type Poly-Si (polysilicon).

FIG. 20A is an energy band view of P-type Poly-Si and P-type SiC. FIG. 20B is an energy band view when P-type Poly-Si and P-type SiC are joined together with $SiO_2$ therebetween.

The work function of N-type Poly-Si is about 4.1 eV, whereas the work function $q\phi_m$ of P-type Poly-Si is about 5.1 eV as shown in FIG. 20A. The work function $q\chi$ of P-type SiC is about 6.78 eV, and hence the threshold voltage can be raised by about 1 V in MISFET that uses P-type Poly-Si as the material of the gate electrode 108 in comparison with MISFET 101 that uses N-type Poly-Si as the material of the gate electrode 108.

However, there is still a difference between the work function $q\phi_m$ of P-type Poly-Si and the work function $q\chi$ of P-type SiC, and therefore, in a MIS structure in which P-type Poly-Si (i.e., the gate electrode 108) is joined to the surface of P-type SiC (i.e., the body region 105) with $SiO_2$ (i.e., the gate insulating film 107) therebetween, the energy band of P-type SiC bends at its surface as shown in FIG. 20B in a state in which a voltage is not applied to P-type Poly-Si (at a time of 0 bias). More specifically, the energy band of P-type SiC bends at the surface of P-type SiC so that conduction band edge inversion is liable to occur near an interface with the gate insulating film 107 in the body region 105, and an off-leakage current cannot be satisfactorily reduced.

In FIG. 20A and FIG. 20B, $Ec_{Si}$ designates the conduction band edge energy of P-type Poly-Si, and $Ef_{Si}$ designates the Fermi level of P-type Poly-Si, and $Ev_{Si}$ designates the valence band edge energy of P-type Poly-Si. Additionally, $Ei_{SiC}$ designates the Fermi level of intrinsic SiC, and $Ev_{SiC}$ designates the valence band edge energy of P-type SiC.

FIG. 21 is a view for explaining the off-angle of the SiC monocrystalline substrate shown in FIG. 19.

The surface 121 of the SiC substrate 102 made of SiC monocrystal is an off-plane inclined by $\theta_7$ in the direction of the [11-20] axis with respect to the just (0001) plane. The angle $\theta_7$ is an off-angle of the SiC substrate 102, and, more specifically, is an angle between the normal [0001] axis of the just (0001) plane and the normal direction $n_7$ of the surface 121 (off-plane).

In the epitaxial growth from the surface on the side of the Si plane of the SiC substrate, if the SiC substrate does not have an off-angle of about 5°, there is a fear that defects in the crystal of the SiC substrate will be easily propagated to the epitaxial layer, and these defects in the crystal will lower the withstand voltage of the semiconductor device. Therefore, conventionally, the withstand voltage of the SiC semiconductor device 101 has been secured by using the SiC substrate 102 whose off-angle $\theta_7$ is 5° or more.

On the other hand, from the viewpoint of securing high channel mobility in the SiC semiconductor device 101, it is preferable to allow each of the side surfaces 118A and 118B of the gate trench 106 in which a channel is formed to be a (11-20) plane perpendicular to the [11-20] axis.

However, the side surfaces 118A and 118B of the gate trench 106 formed in the epitaxial layer 103 having an off-angle are inclined by off-angle $\theta_7$ with respect to the (11-20) plane, and therefore it is difficult to maintain positional relationships therebetween so as to be parallel thereto. Moreover, the gate trench 106 has taper angle $\theta_6$, and therefore the inclination angle with respect to the (11-20) plane of the side surface 118A that is one of the two side surfaces becomes greater by taper angle $\theta_6$ than off-angle $\theta_7$. As a result, disadvantageously, the channel mobility in the side surface 118A falls. Additionally, disadvantageously, when the off-angle is close to 0°, the impurity concentration (carrier concentration) of the epitaxial layer 103 is excessive, and the surface 117 of the epitaxial layer 103 becomes rough.

It is an object of the present invention to provide a semiconductor device capable of improving channel mobility and capable of further lowering an off-leakage current.

It is another object of the present invention to provide a semiconductor device capable of improving channel mobility while securing withstand voltage and capable of correcting the imbalance (ununiformity) in channel characteristics by a plane orientation.

The foregoing or other objects, features, and effects of the present invention will be apparent from a description of embodiments hereinafter given with reference to the accompanying drawings.

BRIEF DESCRIPTION OF THE DRAWINGS

FIG. 8 is a schematic view showing a unit cell having a crystalline structure of 4H—SiC.

FIG. 9 is a view for explaining an off-angle of a SiC monocrystalline substrate shown in FIG. 7.

FIG. 10A is an enlarged view of a main part of one side surface of a gate trench of a conventional SiC semiconductor device.

FIG. 10B is an enlarged view of a main part of the other side surface of the gate trench of the conventional SiC semiconductor device.

FIG. 12 is a schematic sectional view of a semiconductor device according to a fifth embodiment of the present invention.

DETAILED DESCRIPTION OF PREFERRED EMBODIMENTS

Figure 1:
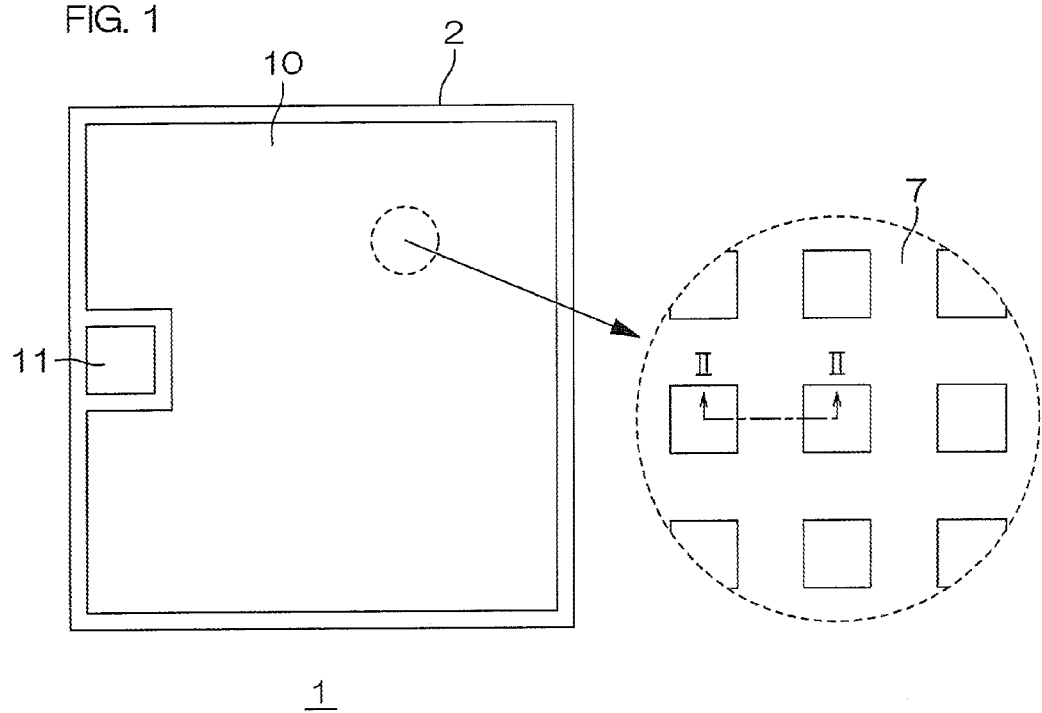
FIG. 1 is a schematic plan view of a semiconductor device according to a first embodiment of the present invention.

A semiconductor device according to an aspect of the present invention includes a semiconductor region made of materials to which conductive impurities are added, an insulating film formed on the surface of the semiconductor region, and a gate electrode formed on the insulating film. The gate electrode is made of a material in which a Fermi level of at least a portion contiguous to the insulating film is closer to a Fermi level of the semiconductor region than a Fermi level of Si, and the gate electrode is electrically conductive.

In a structure in which a trench is formed by being dug downwardly from the upper surface of the semiconductor region and in which a gate electrode is embedded in the trench, the inner surface (side surface and bottom surface) of the trench is included in the concept of the surface of the semiconductor region.

In MISFET in which a surface portion facing the insulating film in the semiconductor region serves as a channel region, channel mobility can be improved by lowering the concentration of conductive impurities of the channel region. However, if the concentration of impurities of the channel region is lowered, the threshold voltage of MISFET will fall.

Therefore, a material whose Fermi level is closer to the Fermi level of the semiconductor region than the Fermi level of Si is employed as the material of at least a portion contiguous to the insulating film in the gate electrode. Accordingly, in a MIS structure formed of the semiconductor region, the insulating film, and the gate electrode, the bend of an energy band of the semiconductor region in a state in which a voltage is not applied to the gate electrode can be reduced in comparison with a case in which Si is employed as the material of the gate electrode. In other words, it can be brought close to an ideal MIS structure. As a result, the threshold voltage of MISFET can be raised, and the off-leakage current can be reduced in comparison with a case in which Si is employed as the material of the gate electrode.

Therefore, an improvement in channel mobility and a further decrease in off-leakage current can be achieved.

Preferably, a material having a wider band gap than the band gap of Si is employed as the material of the semiconductor region. Accordingly, the dielectric breakdown strength of the semiconductor region can be raised.

Additionally, preferably, in a case in which a material having a wider band gap than the band gap of Si is employed as the material of the semiconductor region, the material of the gate electrode has a wider band gap than the band gap of Si. As a result, the bend of the energy band of the semiconductor region in the MIS structure can be made smaller.

Additionally, the material of the semiconductor region may be the same as the material of the gate electrode. For example, the material of the semiconductor region may be P-type SiC, and the material of the gate electrode may be P-type Poly-SiC. Accordingly, the energy band structure of the semiconductor region and the energy band structure of the gate electrode can be approximated to each other. As a result, the bend of the energy band of the semiconductor region in the MIS structure can be made even smaller.

In the present invention, the identity of materials is not hindered by whether impurities have been added to the materials and whether the materials are crystalline (monocrystalline or polycrystalline) or noncrystalline. For example, P-type SiC and N-type Poly-SiC (polycrystalline silicon carbide) are the same in material as each other.

The gate electrode may be made of a material whose Fermi level is closer to the Fermi level of the semiconductor region than the Fermi level of Si in its whole. Preferably, in this case, the material of the gate electrode is the same as the material of the semiconductor region. Preferably, the material of the gate electrode is P-type Poly-SiC, for example, if the material of the semiconductor region is P-type SiC.

Additionally, the gate electrode may be made of a material whose Fermi level is closer to the Fermi level of the semiconductor region than the Fermi level of Si in only a portion contiguous to the insulating film. For example, the gate electrode may include an electroconductive first layer that is contiguous to the insulating film and that is made of a material whose Fermi level is closer to the Fermi level of the semiconductor region than the Fermi level of Si, and an electroconductive second layer that is stacked on the first layer and that is made of a material different from the material of the first layer. Preferably, in this case, the first layer is P-type Poly-SiC, and the second layer is P-type Poly-SiC.

Additionally, preferably, if the semiconductor region and/or the gate electrode contain a P-type impurity, the impurity is B (boron).

Additionally, preferably, the semiconductor region has an impurity concentration of $1 \times 10^{18}$ cm$^{-3}$ or less in its portion located at a depth of 1000 Å or less from the insulating film. Accordingly, channel mobility can be improved in MISFET in which a surface portion facing the insulating film in the semiconductor region serves as a channel region.

Additionally, preferably, if the semiconductor region is formed on a semiconductor substrate, the off-angle of the semiconductor substrate is less than 4° exceeding 0°.

A semiconductor device according to another aspect of the present invention includes a SiC substrate, an epitaxial layer formed on one surface side of the SiC substrate, and a gate trench formed to be dug downwardly from the principal plane of the epitaxial layer, and the off-angle of the SiC substrate is less than 4° exceeding 0°.

The SiC substrate has one surface serving as an off-plane inclined in the direction of the [11-20] axis at less than 4° exceeding 0° with respect to a just (000-1) plane. The angle less than 4° exceeding 0° is the off-angle of the SiC substrate, and is an angle between, for example, the normal axis of the just (0001) plane and the normal direction of the one surface (off-plane). An epitaxial layer is formed by SiC that grows from the one surface of the SiC substrate, and therefore the epitaxial layer has a principal plane parallel to the one surface of the SiC substrate.

Therefore, an inclination angle of the side surface of the gate trench with respect to the (11-20) plane perpendicular to the [11-20] axis becomes smaller than the angle of the side surface of the gate trench formed in the epitaxial layer that has an off-angle of 4° or more. Accordingly, the positional relationship of the side surface of the gate trench with respect to the (11-20) plane can be brought close to a parallel relationship, and therefore channel mobility can be improved. Additionally, the imbalance (ununiformity) of channel characteristics by a plane orientation can be controlled. Additionally, an appropriate impurity concentration and flatness of the epitaxial layer can be maintained.

Preferably, one surface of the SiC substrate is a C plane. In this case, the bottom surface of the gate trench is a surface inclined in the direction of the [11-20] axis by an off-angle with respect to the just (000-1) plane. Therefore, when a semiconductor device is produced, the oxidation of the bottom surface and the side surface of the gate trench proceeds under the condition that the oxidation rate of the bottom surface of the gate trench and the oxidation rate of the side surface satisfy the relational expression: oxidation rate of the bottom surface/oxidation rate of the side surface>1. As a result, a gate insulating film in which, for example, a portion on the bottom surface is thicker than a portion on the side surface can be formed. Therefore, the dielectric breakdown of the portion on the bottom surface can be prevented, and withstand voltage can be improved by appropriately designing the thickness of the portion on the bottom surface in the gate insulating film.

Preferably, the off-angle of the SiC substrate is 0.3° or more and is less than 4°, and, more preferably, is 1°. Accordingly, an electric current (drain current) flowing through the channel and a voltage (gate threshold voltage) produced when the electric current begins to flow can be fixed at substantially constant magnitudes, respectively, in all plane orientations without causing variations by the plane orientation of the sidewall of the gate trench. The gate trench may be formed in a tapered manner.

Preferably, if a body region is formed beside the gate trench in the epitaxial layer and if a gate electrode facing the body region with a gate insulating film therebetween is formed on the side surface of the gate trench, the gate electrode is formed by using the same material as the body region.

In this case, the whole of the gate electrode may be made of the same material as the body region. For example, if the material of the body region is P-type SiC, the material of the gate electrode may be P-type Poly-SiC.

Additionally, only a portion of the gate electrode contiguous to the gate insulating film may be made of the same material as the body region. For example, if the material of the body region is P-type SiC, the gate electrode may have a layered structure consisting of a first layer that is contiguous to the gate insulating film and made of P-type Poly-SiC and a second layer that is stacked on the first layer and made of P-type Poly-Si.

Preferably, the body region has an impurity concentration of $1\times10^{18}$ $cm^{-3}$ or less in its portion located at a depth of 1000 Å or less from the gate insulating film. Accordingly, the mobility of the channel formed in the body region can be further improved.

A semiconductor device according to still another aspect of the present invention includes a first conductivity type SiC substrate, a first conductivity type epitaxial layer formed on a side of one surface of the SiC substrate, a second conductivity type body region formed on a surface portion of the epitaxial layer, a gate trench formed in the epitaxial layer so as to penetrate the body region from the surface of the epitaxial layer, a gate insulating film formed on an inner surface of the gate trench, and a gate electrode formed on the gate insulating film. The off-angle of the SiC substrate is less than 4° exceeding 0°, and the gate electrode is made of the same material as the body region.

The SiC substrate has one surface serving as an off-plane inclined in the direction of the [11-20] axis at less than 4° exceeding 0° with respect to a just (000-1) plane. The angle less than 4° exceeding 0° is the off-angle of the SiC substrate, and is an angle between, for example, the normal axis of the just (0001) plane and the normal direction of the one surface (off-plane). An epitaxial layer is formed by SiC that grows from the one surface of the SiC substrate, and therefore the epitaxial layer has a principal plane parallel to the one surface of the SiC substrate.

Therefore, an inclination angle of the side surface of the gate trench with respect to the (11-20) plane perpendicular to the [11-20] axis becomes smaller than the angle of the side surface of the gate trench formed in the epitaxial layer that has an off-angle of 4° or more. Accordingly, the positional relationship of the side surface of the gate trench with respect to the (11-20) plane can be brought close to a parallel relationship, and therefore channel mobility can be improved. Additionally, the imbalance (ununiformity) of channel characteristics by a plane orientation can be controlled. Additionally, an appropriate impurity concentration and flatness of the epitaxial layer can be maintained.

The material of the body region is the same as the material of the gate electrode. For example, the material of the body region is P-type SiC, and the material of the gate electrode is P-type Poly-SiC. Accordingly, the energy band structure of the body region and the energy band structure of the gate electrode can be approximated to each other. As a result, the bend of the energy band of the body region in the MIS structure can be made small. In other words, it can be brought close to an ideal MIS structure. As a result, the threshold voltage of MISFET can be raised, and the off-leakage current can be reduced in comparison with a case in which Si is employed as the material of the gate electrode. Therefore, an improvement in channel mobility and a further decrease in off-leakage current can be achieved.

Preferably, the body region has an impurity concentration of $1\times10^{18}$ $cm^{-3}$ or less in its portion located at a depth of 1000 Å or less from the gate insulating film. Accordingly, the mobility of the channel formed in the body region can be further improved.

Preferably, if it is supposed that the gate insulating film is divided into a first portion on the bottom surface of the gate trench and a second portion on the side surface of the gate trench, the first portion is thicker than the second portion. Accordingly, the dielectric breakdown of the portion on the bottom surface can be prevented, and withstand voltage can be improved.

Hereinafter, embodiments of the present invention will be concretely described with reference to the accompanying drawings.

First to Third Embodiments

Figure 2:
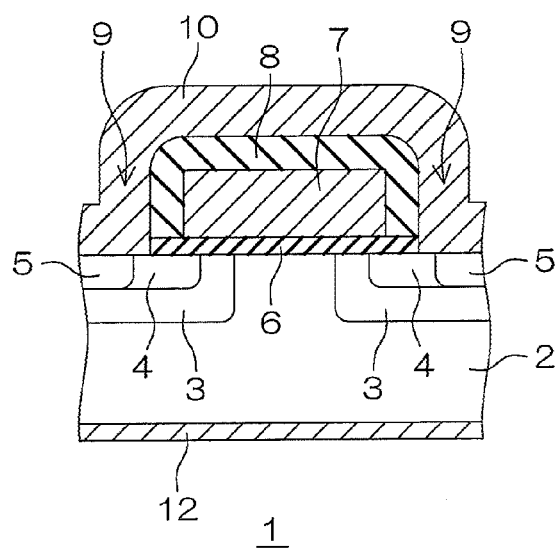
FIG. 2 is a schematic sectional view of the semiconductor device along line II-II of FIG. 1.

FIG. 1 is a schematic plan view of a semiconductor device according to a first embodiment of the present invention. FIG. 2 is a schematic sectional view of the semiconductor device along line II-II of FIG. 1.

The semiconductor device 1 has a quadrangular external shape (substantially square shape) when viewed planarly as shown in FIG. 1.

The semiconductor device 1 includes a semiconductor substrate 2 as shown in FIG. 2. The semiconductor substrate 2 is made of, for example, N-type SiC doped with N-type impurities. The semiconductor substrate 2 has an off-angle of, for example, less than 4° exceeding 0°. The semiconductor substrate 2 may consist of a monolayer of N-type SiC, or may be formed by stacking an N-type SiC layer on the N-type SiC substrate (for example, by epitaxial growth).

A plurality of P-type body regions (well regions) 3 are formed at a surface portion of the semiconductor substrate 2. The body regions 3 each have a quadrangular shape (substantially square shape) when viewed planarly, and are arranged in a matrix manner. The depth of each body region 3 is, for example, 5000 Å to 6500 Å (500 nm to 650 nm). Each body region 3 has an impurity concentration profile in which the P-type impurity concentration of a portion whose depth is 1000 Å (100 nm) or less based on the center in the thickness direction of a gate insulating film 6 described later is $1\times10^{18}$ $cm^{-3}$ or less.

An N-type source region 4 is formed at a surface portion of each body region 3 with a gap with respect to the peripheral edge of the body region 3.

A P+-type body contact region 5 doped with a higher concentration of P-type impurities than the body region 3 is formed inside each source region 4. Each body contact region 5 is formed to penetrate the source region 4 in the depth direction.

The gate insulating film 6 is formed on the surface of the semiconductor substrate 2. The gate insulating film 6 is made of, for example, $SiO_2$. The thickness of the gate insulating film 6 is, for example, about 400 Å (40 nm).

A gate electrode 7 is formed on the gate insulating film 6. The gate electrode 7 is formed like a grid when viewed planarly as shown in FIG. 1. In FIG. 1, the gate electrode 7 is shown in such a way as to see through an interlayer insulating film 8 and a source metal 10 described later. The gate electrode 7 is made of P-type Poly-SiC doped with B (i.e., boron) that is a P-type impurity.

The interlayer insulating film 8 is formed on the semiconductor substrate 2 as shown in FIG. 2. The surface of the semiconductor substrate 2, as well as the gate electrode 7, is covered with the interlayer insulating film 8. The interlayer insulating film 8 is made of, for example, $SiO_2$.

The interlayer insulating film 8 has a contact hole 9 formed at a position facing each body contact region 5. Each contact hole 9 penetrates the gate insulating film 6, and the whole area of the body contact region 5 and a portion around the body contact region 5 in the source region 4 face the inside of each contact hole 9.

A source metal 10 is formed on the interlayer insulating film 8. The source metal 10 enters each contact hole 9 formed in the interlayer insulating film 8, and is connected to the source region 4 and the body contact region 5. The source metal 10 is made of, for example, a metallic material whose principal component is Al. To achieve the ohmic contact of the source metal 10 with respect to the source region 4 and the body contact region 5, an ohmic metal made of Ni may be formed on the lower layer of the source metal 10.

On the center of a portion along one sideline of the semiconductor substrate 2, the interlayer insulating film 8 and the source metal 10 are selectively removed, and, as a result, an opening that exposes a portion of the gate electrode 7 as a gate pad 11 used to be connected to the outside is formed as shown in FIG. 1.

A drain metal 12 is formed on the entire surface of the back side of the semiconductor substrate 2.

In a state in which the source metal 10 is grounded and in which an appropriate positive voltage is applied to the drain metal 12, the electric potential (gate voltage) of the gate electrode 7 is controlled, and, as a result, a channel is formed near an interface with the gate insulating film 6 in the body region 3, and an electric current flows between the source metal 10 and the drain metal 12.

Figure 3A:
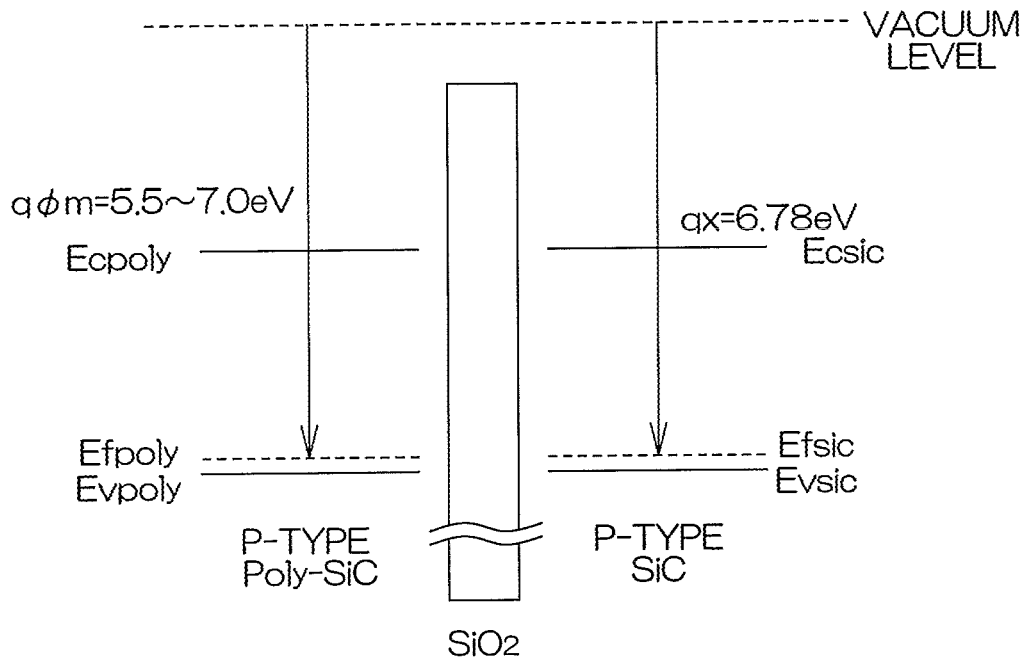
FIG. 3A is an energy band view of P-type Poly-SiC and P-type SiC.
Figure 3B:
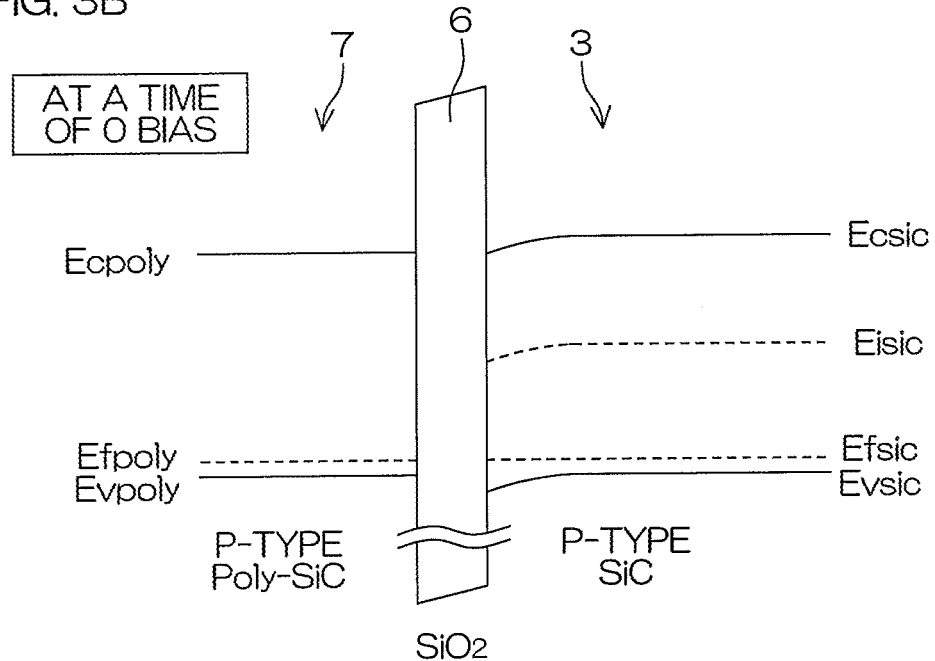
FIG. 3B is an energy band view when P-type Poly-SiC and P-type SiC are joined together with $SiO_2$ placed therebetween.

FIG. 3A is an energy band view of P-type Poly-SiC and P-type SiC. FIG. 3B is an energy band view when P-type Poly-SiC and P-type SiC are joined together with $SiO_2$ placed therebetween.

As shown in FIG. 3A, the work function $q\chi$ of P-type SiC that is the material of the body region 3 is about 6.78 eV. On the other hand, the work function $q\phi_m$ of P-type Poly-SiC that is the material of the gate electrode 7 is 5.5 eV to 7.0 eV. The work function of P-type Poly-Si is about 5.1 eV. Therefore, the Fermi level $Ef_{poly}$ of P-type Poly-SiC is closer to the Fermi level $Ef_{SiC}$ of P-type SiC than the Fermi level of Si.

Therefore, in a MOS structure in which the gate electrode 7 is joined to the surface of the body region 3 with $SiO_2$ that is the material of the gate insulating film 6 and that is placed therebetween, the bend of the energy band of the body region 3 is hardly made in a state (at a time of 0 bias) in which a voltage is not applied to the gate electrode 7 as shown in FIG. 3B. In other words, the semiconductor device 1 has a MOS structure close to an ideal MOS structure. Therefore, in the semiconductor device 1, an inversion does not easily occur near an interface with the gate insulating film 6 in the body region 3 in a state in which a voltage is not applied to the gate electrode 7.

In FIG. 3A and FIG. 3B, $Ec_{poly}$ designates the conduction band edge energy of P-type Poly-SiC, and $Ev_{poly}$ designates the valence band edge energy of P-type Poly-SiC. $Ec_{SiC}$ designates the conduction band edge energy of P-type SiC, and $Ev_{SiC}$ designates the valence band edge energy of P-type SiC. $Ei_{SiC}$ designates the Fermi level of intrinsic SiC.

As mentioned above, P-type Poly-SiC whose Fermi level $Ef_{poly}$ is closer to the Fermi level of the body region 3 than the Fermi level of Si is employed as the material of the gate electrode 7. Accordingly, in the MOS (MIS) structure formed of the body region 3, the gate insulating film 6, and the gate electrode 7, the bend of the energy band of the body region 3 in a state in which a voltage is not applied to the gate electrode 7 can be reduced in comparison with a case in which Si is employed as the material of the gate electrode 7. As a result, the threshold voltage of MOSFET of the semiconductor device 1 can be raised, and an off-leakage current can be reduced in comparison with a case in which Si is employed as the material of the gate electrode 7.

The P-type impurity concentration of a surface portion facing the gate insulating film 6 in the body region 3, i.e., the P-type impurity concentration of the channel region is set at a low concentration of $1\times10^{18}$ cm$^{-3}$ or less, and therefore channel mobility can be improved.

Therefore, in the semiconductor device 1, an improvement in channel mobility and a decrease in off-leakage current can be achieved.

SiC has a wider band gap than the band gap of Si. Therefore, dielectric breakdown strength can be raised by employing SiC as the material of the semiconductor substrate 2 (i.e., body region 3) in comparison with a case in which Si is employed as the material of the semiconductor substrate 2.

FIG. 4A to FIG. 4E are schematic sectional views for sequentially explaining the steps of a manufacturing process of the semiconductor device.

Figure 4A:
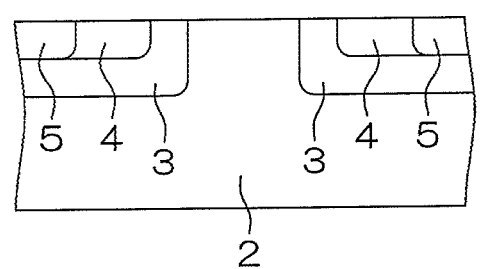
FIG. 4A to FIG. 4E are schematic sectional views for explaining a manufacturing method of the semiconductor device in order of steps.

In the manufacturing process of the semiconductor device 1, first, Al that is a P-type impurity used to form the body region 3 is selectively injected (implanted) into the surface portion of the semiconductor substrate 2 as shown in FIG. 4A. Furthermore, Al that is a P-type impurity used to form the body contact region 5 is selectively injected into the surface portion of the body region 3. Furthermore, P (phosphorus) that is an N-type impurity used to form the source region 4 is selectively injected into the surface portion of the body region 3. Thereafter, annealing is performed, and the body region 3, the source region 4, and the body contact region 5 are formed at the surface portion of the semiconductor substrate 2.

Figure 4B:
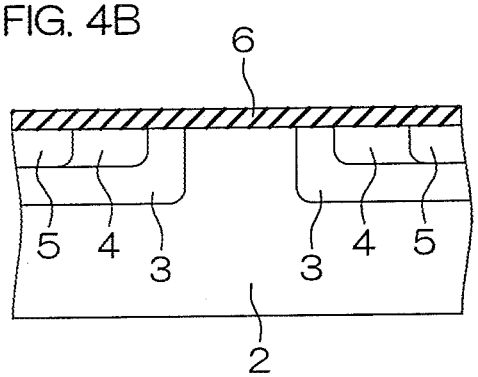

Next, as shown in FIG. 4B, the gate insulating film 6 is formed on the surface of the semiconductor substrate 2 according to a thermal oxidation method.

Figure 4C:
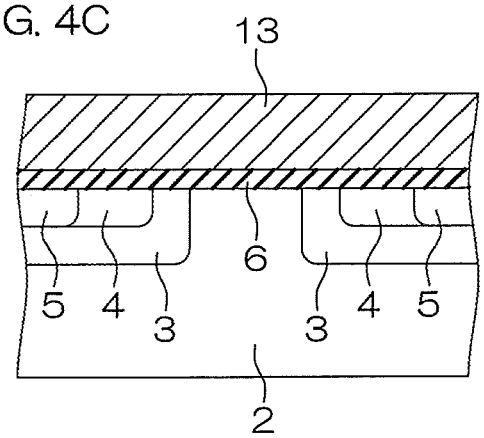

Thereafter, as shown in FIG. 4C, Poly-SiC is deposited with a thickness of about 5000 Å (500 nm) on the gate insulating film 6 according to a CVD (Chemical Vapor Deposition) method. Next, a deposition layer 13 of Poly-SiC is doped with B in order to change the deposition layer 13 of Poly-SiC to the deposition layer of P-type Poly-SiC. The doping by use of B is achieved by an ion implantation method in which, for example, the injection energy is 100 keV and the dose amount is $2\times10^{15}$ cm$^{-2}$. After the doping by use of B, annealing is performed to activate this B. The annealing temperature is, for example, 1600° C.

Figure 4D:
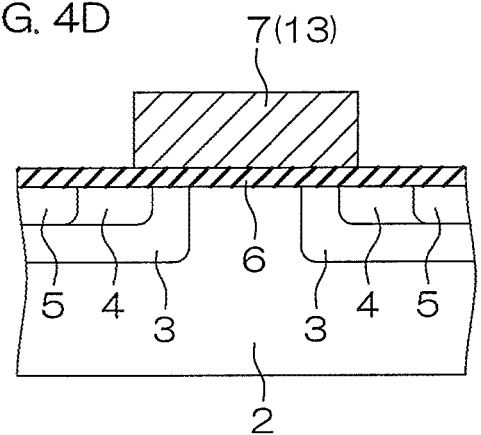

Next, as shown in FIG. 4D, the deposition layer of P-type Poly-SiC is selectively removed, and the gate electrode 7 made of P-type Poly-SiC is formed on the gate insulating film 6 according to photolithography and etching.

Figure 4E:
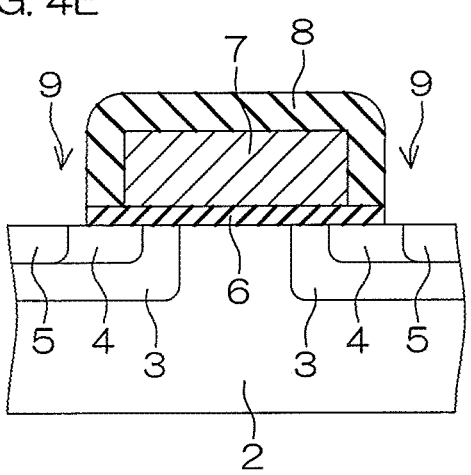

Next, as shown in FIG. 4E, the interlayer insulating film 8 is formed on the semiconductor substrate 2 according to the CVD method. Furthermore, the contact hole 9, which penetrates the interlayer insulating film 8 and the gate insulating film 6, is formed according to photolithography and etching.

Thereafter, the source metal 10 is formed on the interlayer insulating film 8 according to a sputtering method. Furthermore, the gate pad 11 is formed according to photolithography and etching. Furthermore, the drain metal 12 is formed on the back side of the semiconductor substrate 2 according to the sputtering method. The semiconductor device 1 of FIG. 1 can be obtained in this way.

Figure 5:
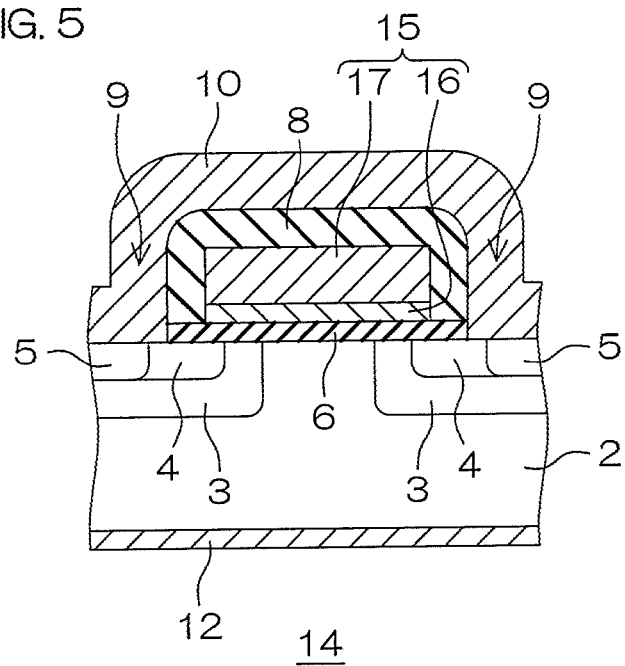
FIG. 5 is a schematic sectional view of a semiconductor device according to a second embodiment of the present invention.

FIG. 5 is a schematic sectional view of a semiconductor device according to a second embodiment of the present invention. In FIG. 5, the same reference numeral as in FIG. 2 is given to an element equivalent to each element of FIG. 2. When a structure shown in FIG. 5 is described, only differences between the structure of FIG. 2 and that of FIG. 5 are described, and the element to which the same reference numeral as in FIG. 2 is given is not described hereinafter.

In the semiconductor device 14 shown in FIG. 5, the gate electrode 15 formed on the gate insulating film 6 has a two-layer structure consisting of a first layer 16 contiguous to the gate insulating film 6 and a second layer 17 stacked on the first layer 16.

The first layer 16 is made of P-type Poly-SiC whose Fermi level is closer to the Fermi level of the body region 3 than the Fermi level of Si.

The second layer 17 is made of a material different from that of the first layer 16. More specifically, the second layer 17 is made of P-type Poly-Si, or N-type Poly-Si, or a metal.

The same operation and effect as the semiconductor device 1 of FIG. 2 can be fulfilled by the structure of the semiconductor device 14.

Figure 6:
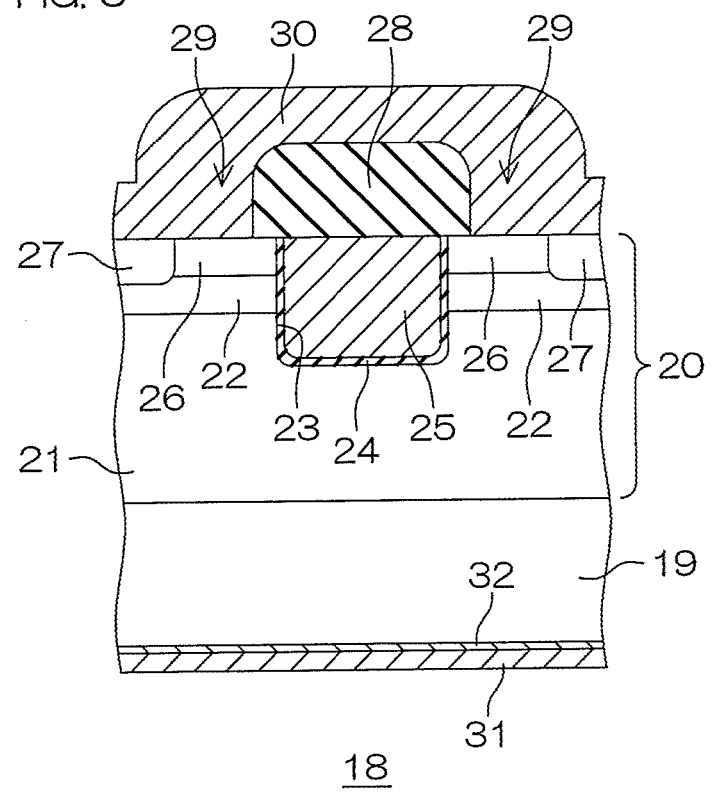
FIG. 6 is a schematic sectional view of a semiconductor device according to a third embodiment of the present invention.

FIG. 6 is a schematic sectional view of a semiconductor device according to a third embodiment of the present invention.

Although the semiconductor device 1 of FIG. 2 and the semiconductor device 14 of FIG. 5 have a vertical MOSFET (Metal Oxide Semiconductor Field Effect Transistor) that employs a planar gate structure, the semiconductor device 18 of FIG. 6 has a MOSFET that employs a trench gate structure.

The semiconductor device 18 includes an N-type SiC substrate 19 made of N$^+$-type SiC.

An N-type SiC layer 20 made of N$^-$-type SiC is formed on the N-type SiC substrate 19 by epitaxial growth. A base portion of the N-type SiC layer 20 remains without changes after epitaxial growth, and serves as an N$^-$-type drain region 21. A surface portion of the N-type SiC layer 20 is allowed to serve as a P-type body region (well region) 22 by being doped with P-type impurities.

A gate trench 23 is dug into the N-type SiC layer 20 downwardly from its surface. In the same way as, for example, the gate electrode 7 shown in FIG. 1, the gate trench 23 is formed like a grid when viewed planarly. The gate trench 23 penetrates the body region 22, and its deepest portion reaches the drain region 21.

A gate insulating film 24 is formed on the inner surface of the gate trench 23. The gate insulating film 24 is made of, for example, SiO$_2$. The thickness of the gate insulating film 24 is, for example, about 400 Å (40 nm).

The inside of the gate insulating film 24 is filled with P-type Poly-SiC doped with B (boron) that is a P-type impurity, and, as a result, a gate electrode 25 made of this P-type Poly-SiC is embedded in the gate trench 23.

An N$^+$-type source region 26 is formed at a surface portion of the body region 22.

Additionally, a P$^+$-type body contact region 27 penetrating the source region 26 in the thickness direction is formed at the surface portion of the body region 22 at a position with a space with respect to the gate trench 23 in each region surrounded by the gate trench 23.

An interlayer insulating film 28 is stacked on the N-type SiC layer 20. The interlayer insulating film 28 is made of, for example, SiO$_2$.

The interlayer insulating film 28 has a contact hole 29 penetrating therethrough at a position facing each body contact region 27. The whole area of the body contact region 27 and a portion around the body contact region 27 in the source region 26 face the inside of each contact hole 29.

A source metal 30 is formed on the interlayer insulating film 28. The source metal 30 enters each contact hole 29, and is connected to the source region 26 and the body contact region 27. The source metal 30 is made of, for example, a metallic material whose principal component is Al. To achieve the ohmic contact of the source metal 30 with respect to the source region 26 and the body contact region 27, an ohmic metal made of Ni may be formed on the lower layer of the source metal 30.

A drain metal 31 is formed on the entire surface of the back side of the N-type SiC substrate 19. The drain metal 31 is made of, for example, a metallic material whose principal component is Al. To achieve the ohmic contact of the drain metal 31 with respect to the N-type SiC substrate 19, an ohmic metal 32 made of Ni may be formed between the N-type SiC substrate 19 and the drain metal 31 as shown in FIG. 6.

In a state in which the source metal 30 is grounded and in which an appropriate positive voltage is applied to the drain metal 31, the electric potential (gate voltage) of the gate electrode 25 is controlled, and, as a result, a channel is formed near an interface with the gate insulating film 24 in the body region 22, and an electric current flows between the source metal 30 and the drain metal 31.

The same operation and effect as the semiconductor devices 1 and 14 can be fulfilled by the structure of the semiconductor device 18.

Although the first to third embodiments of the present invention have been described as above, the present invention can be embodied in other forms.

Without being limited to P-type Poly-SiC, materials whose Fermi level is closer to the Fermi level of the body regions 3 and 22 than the Fermi level of Si can be widely employed, for example, as the material of the gate electrode 7, as the material of the first layer 16, and as the material of the gate electrode 25.

Preferably, materials whose band gap is wider than the band gap of Si are employed as the material of the gate electrode 7, as the material of the first layer 16, and as the material of the gate electrode 25. Examples of materials suitable as the material of the gate electrode 7, as the material of the first layer 16, and as the material of the gate electrode 25 include SiC doped with N-type impurities or P-type impurities, diamond doped with N-type impurities or P-type impurities, BN (boron nitride) doped with N-type impurities or P-type impurities, AlN (aluminum nitride) doped with N-type impurities or P-type impurities, GaN (gallium nitride) doped with N-type impurities or P-type impurities, GaAs (gallium arsenide) doped with N-type impurities or P-type impurities, GaP (gallium phosphide) doped with N-type impurities or P-type impurities, and ZnO (zinc oxide) doped with N-type impurities or P-type impurities.

SiC, diamond, BN, AlN, GaN, GaAs, GaP, and ZnO may be monocrystalline, or polycrystalline, or amorphous. If these materials are polycrystalline or amorphous, there is an advantage in the fact that their films can be more easily formed than monocrystalline materials.

B, Al, Ga (gallium), and In (indium) can be mentioned as P-type impurities with which SiC and diamond are doped.

N (nitrogen), P (phosphorus), As (arsenic), and Sb (antimony) can be mentioned as N-type impurities with which SiC and diamond are doped.

Be (beryllium), Mg (magnesium), Ca (calcium), and Sr (strontium) can be mentioned as P-type impurities with which BN, AlN, GaN, GaAs, GaP, and ZnO are doped.

C (carbon), Si, Ge (germanium), and Sn (tin) can be mentioned as N-type impurities with which BN, AlN, GaN, GaAs, GaP, and ZnO are doped.

Although a structure having a vertical MOSFET has been provided as an example in the above embodiments, the present invention can be applied to a structure having a lateral MOSFET.

Fourth and Fifth Embodiments

Figure 7:
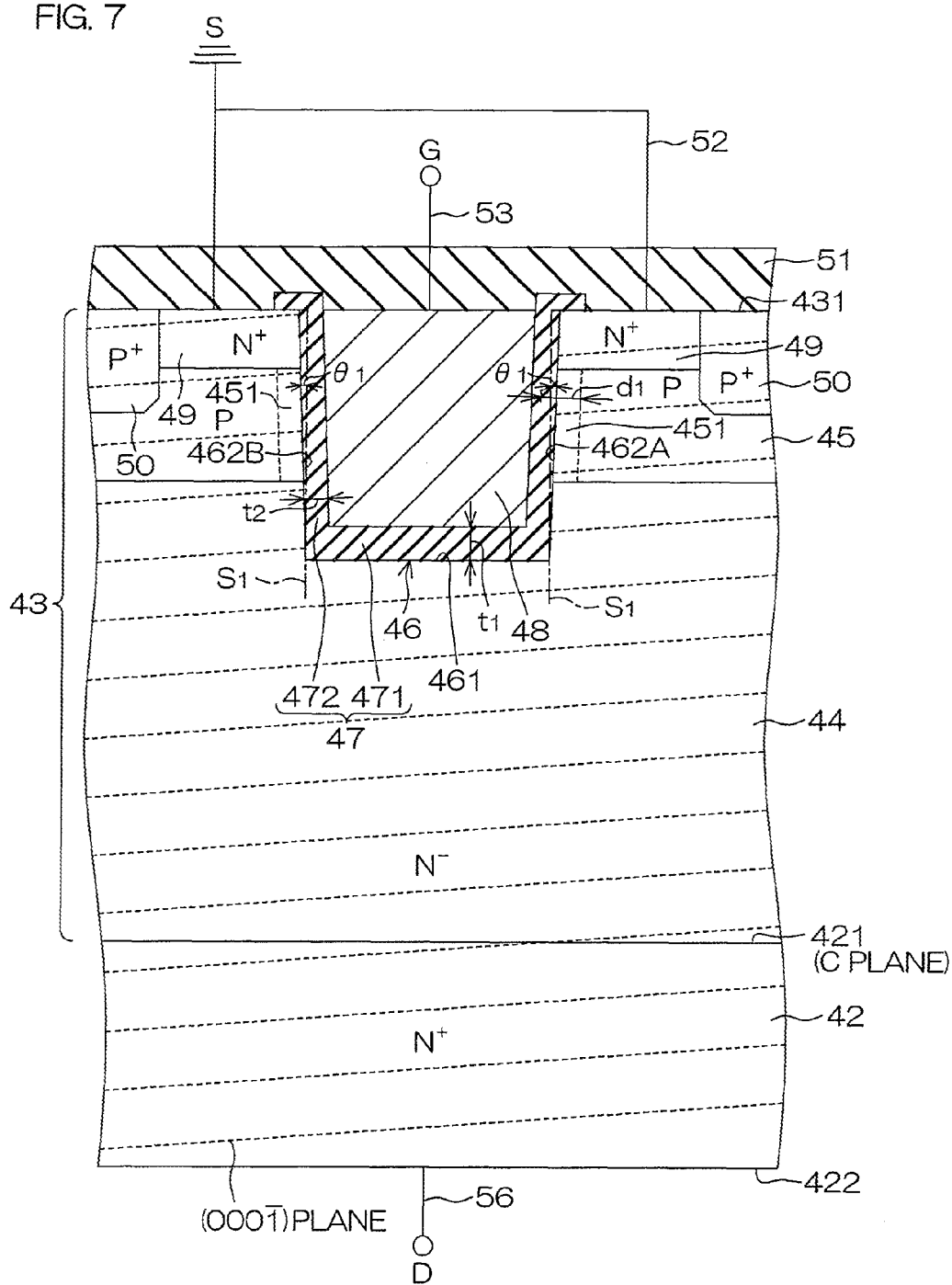
FIG. 7 is a schematic sectional view of a semiconductor device according to a fourth embodiment of the present invention.

FIG. 7 is a schematic sectional view of a semiconductor device according to a fourth embodiment of the present invention.

The semiconductor device 41 has a structure in which a plurality of unit cells of a trench-gate type VDMOSFET are arranged. In FIG. 7, a part of the unit cells is shown.

The semiconductor device 41 includes a 4H—SiC substrate 42 that serves as a foundation of the semiconductor device 41. The SiC substrate 42 is made of SiC monocrystal, and is a substrate having an off-angle at which a surface 421, which is a C plane defined as a principal plane (surface 421) on whose outermost surface C-atoms appear, is inclined in the direction of a [11-20] axis with respect to a (0001) plane. The SiC substrate 42 is doped with a high concentration of N-type impurities. The N-type impurity concentration is, for example, $1\times10^{17}$ cm$^{-3}$ or more, and, preferably, $1\times10^{18}$ cm$^{-3}$ to $1\times10^{21}$ cm$^{-3}$. In FIG. 7, the (000-1) plane in the semiconductor device 41 is shown by the broken line.

An N$^-$-type epitaxial layer 43 made of SiC doped with a lower concentration of N-type impurities than the SiC substrate 42 is stacked on the surface 421 of the SiC substrate 42. The epitaxial layer 43 is made of SiC that grows from the surface 421 of the SiC substrate 42, and has a principal plane (i.e., surface 431) parallel to the surface 421.

A base portion of the epitaxial layer 43 serves as an N$^-$-type drain region (drift region) 44 whose whole remains without changes after epitaxial growth. The N-type impurity concentration of the drain region 44 is, for example, $1\times10^{15}$ cm$^{-3}$ to $1\times10^{17}$ cm$^{-3}$.

On the other hand, a P-type body region 45 is formed at a surface portion of the epitaxial layer 43. The body region 45 is contiguous to the drain region 44. The P-type impurity concentration of the body region 45 is, for example, $1\times10^{16}$ cm$^{-3}$ to $1\times10^{19}$ cm$^{-3}$.

A gate trench 46 is dug into the epitaxial layer 43 downwardly from the surface 431. The gate trenches 46 (not shown in FIG. 7) are formed at predetermined intervals therebetween, and are extended in parallel with each other in the same direction (which is a direction perpendicular to the sheet surface of FIG. 7 and which can be hereinafter referred to as a "direction along the gate width"), and, for example, have a stripe structure.

The gate trench 46 penetrates the body region 45 in the layer thickness direction, and its deepest portion (bottom surface 461) reaches the drain region 44. The gate trench 46 is formed in a tapered manner such that the distance between a side surface 462A and a side surface 462B that face each other becomes narrower in proportion to progress in the depth direction. For example, an inclination angle $\theta_1$ (taper angle $\theta_1$) of the side surfaces 462A and 462B with respect to a virtual surface $S_1$ perpendicular to the surface 431 of the epitaxial layer 43 is 0° to 50°, preferably, 0° to 1°.

A gate insulating film 47 made of SiO$_2$ is formed on the inner surface (bottom surface 461, side surfaces 462A and 462B) of the gate trench 46 and on the surface 431 of the epitaxial layer 43 so as to cover the whole of the inner surface of the gate trench 46.

The gate insulating film 47 integrally has a bottom portion 471 placed on the bottom surface 461 of the gate trench 46 and a side portion 472 placed on the side surfaces 462A and 462B of the gate trench 46. Thickness $t_1$ of the bottom portion 471 is greater than thickness $t_2$ of the side portion 472. For example, $t_1$ is 0.1 μm to 2 μm, and $t_2$ is 0.05 μm to 0.2 μm.

The body region 45 has a P-type impurity concentration of $1\times10^{18}$ cm$^{-3}$ or less (preferably, $7\times10^{17}$ cm$^{-3}$ to $9\times10^{17}$ cm$^{-3}$) in a region 451 whose depth $d_1$ from the center in the thickness direction of the side portion 472 of the gate insulating film 47 is 1000 Å or less.

The inside of the gate insulating film 47 is filled with a polysilicon material (P-type Poly-SiC) doped with P-type impurities, and, as a result, a gate electrode 48 is embedded in the gate trench 46.

An N$^+$-type source region 49 is formed at a surface portion of the body region 45 on both sides in a direction (rightward-leftward direction in FIG. 7) perpendicular to the gate width with respect to the gate trench 46. The source region 49 is a region doped with a high concentration of N-type impurities, higher than the N-type impurity concentration of the drain region 44. The N-type impurity concentration of the source region 49 is, for example, $1\times10^{18}$ cm$^{-3}$ to $1\times10^{21}$ cm$^{-3}$. The source region 49 extends in the direction along the gate width at a position contiguous to the gate trench 46, and its bottom portion is contiguous to the body region 45.

The epitaxial layer 43 additionally has a P$^+$-type body contact region 50 that penetrates a center portion of the source region 49 in the direction perpendicular to the gate width from the surface 431 and that is connected to the body region 45. The body contact region 50 is a region doped with a high concentration of P-type impurities, higher than the P-type impurity concentration of the body region 45. The P-type impurity concentration of the body contact region 50 is, for example, $1\times10^{18}$ cm$^{-3}$ to $1\times10^{21}$ cm$^{-3}$.

In other words, the gate trench 46 and the source region 49 are alternately disposed in the direction perpendicular to the gate width, and extend in the direction along the gate width. The boundary between unit cells contiguous in the direction perpendicular to the gate width is set along the source region 49 on the source region 49. At least one body contact region 50 is provided in such a way as to stretch over both unit cells contiguous in the direction perpendicular to the gate width. The boundary between unit cells contiguous in the direction along the gate width is set so that the gate electrode 48 contained in each unit cell has a predetermined gate width.

An interlayer insulating film 51 made of $SiO_2$ is stacked on the epitaxial layer 43. A source wiring 52 is connected to the source region 49 via a contact hole (not shown) formed in the interlayer insulating film 51. The source wiring 52 is grounded.

Agate wiring 54 is connected to the gate electrode 48 via another contact hole (not shown) formed in the interlayer insulating film 51.

A drain wiring 56 is connected to a back surface 422 opposite to the surface 421 of the SiC substrate 42.

A predetermined voltage (voltage greater than the gate threshold voltage) is applied to the gate wiring 54 in a state in which a predetermined potential difference is generated between the source wiring 52 and the drain wiring 56 (in the source-drain), and, as a result, a channel is formed near an interface with the gate insulating film 47 in the body region 45 by means of an electric field from the gate electrode 48. As a result, an electric current flows between the source wiring 52 and the drain wiring 56, and the VDMOSFET reaches an ON state.

FIG. 8 is a schematic view showing a unit cell having a crystalline structure of 4H—SiC.

The crystalline structure of 4H—SiC can be approximated by a hexagonal system, and four carbon atoms are connected to one silicon atom. The four carbon atoms are located on four vertexes of a regular tetrahedron with a silicon atom located at the center of regular tetrahedron thereof. One of four carbon atoms is located in the direction of the [0001] axis with respect to a silicon atom, while the remaining three carbon atoms are located on the side of the [000-1] axis with respect to a silicon atom.

The [0001] axis and the [000-1] axis extend in the axial direction of a hexagonal cylinder, and the surface (top face of the hexagonal cylinder) to which the [0001] axis is normal is a (0001) plane (Si plane). On the other hand, the surface (undersurface of the hexagonal cylinder) to which the [000-1] axis is normal is a (000-1) plane (C plane).

Side surfaces of the hexagonal cylinder to which the [1-100] axis is normal are (1-100) planes, respectively, and the surface that passes through a pair of not-adjoined ridge lines and to which the [11-20] axis is normal is a (11-20) plane. These planes are crystal planes perpendicular to the (0001) plane and the (000-1) plane.

For example, a SiC monocrystalline substrate in which the (000-1) plane (C plane) is a principal plane can be produced by being cut out from a SiC monocrystal ingot in which the (000-1) plane (C plane) is a principal plane so that an azimuth error (off-angle) relative to both the direction of the [1-100] axis and the direction of the [11-20] axis becomes less than 4° exceeding 0° (preferably, 0.3° or more and less than 4°, and more specifically preferably, 1°). The SiC substrate 42 in which the (000-1) plane (C plane) is a principal plane (surface 421) can be obtained by being cut out in this way.

SiC is allowed to grow on the thus obtained SiC substrate 42 according to, for example, a chemical vapor growth method, and, as a result, the epitaxial layer 43 is formed.

FIG. 9 is a view for explaining an off-angle of the SiC monocrystalline substrate shown in FIG. 7.

The surface 421 of the SiC substrate 42 made of SiC monocrystal is an off-plane inclined in the direction of the [11-20] axis by $\theta_3$ with respect to the just (000-1) plane. The angle $\theta_3$ is an off-angle of the SiC substrate 42. More specifically, the angle $\theta_3$ is an angle between the normal [000-1] axis of the just (000-1) plane and the normal direction $n_3$ of the surface 421 (off-plane).

As mentioned above, according to the semiconductor device 41, the epitaxial layer 43 is formed on the side of the (000-1) plane (Cplane) of the SiC substrate 42, and the off-angle $\theta_3$ of the SiC substrate 42 is less than 4° exceeding 0°. The epitaxial layer 43 is formed by SiC that grows from the surface 421 of the SiC substrate 42, and therefore the epitaxial layer 43 has the surface 431 parallel to the surface 421 of the SiC substrate 42.

Therefore, the inclination angle of the gate trench side surfaces 462A and 462B with respect to the (11-20) plane becomes smaller than the angle of the side surface of the gate trench formed in the epitaxial layer having an off-angle of 4° or more.

More specifically, as shown in FIG. 10A and FIG. 10B, the virtual surface $S_6$ is a surface perpendicular to the surface 117 (i.e., off-plane inclined by off-angle $\theta_7$ with respect to the (0001) plane) in the conventional semiconductor device 101 (see FIG. 6), and hence is inclined by off-angle $\theta_7$ with respect to the (11-20) plane. Therefore, the inclination angle $\theta_{4A}$ with respect to the (11-20) plane of the side surface 118A that is one of the side surfaces 118A and 118B of the gate trench 106 is the sum (for example, 6° or more) of off-angle $\theta_7$ of the SiC substrate 102 and taper angle $\theta_6$ of the gate trench 106 (see FIG. 10B). Inclination angle $\theta_{4B}$ with respect to the (11-20) plane of the other side surface 118B is a difference (for example, or more) between off-angle $\theta_7$ of the SiC substrate 102 and taper angle $\theta_6$ of the gate trench 106 (see FIG. 10A).

Figure 11B:
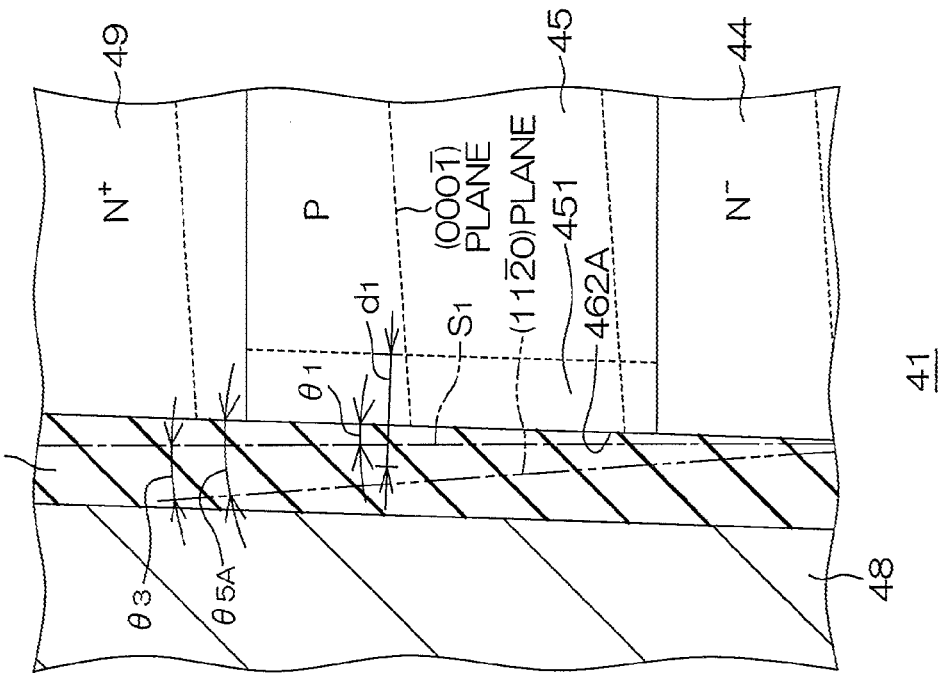
FIG. 11B is an enlarged view of a main part of the other side surface of the gate trench of the semiconductor device shown in FIG. 7.
Figure 11A:
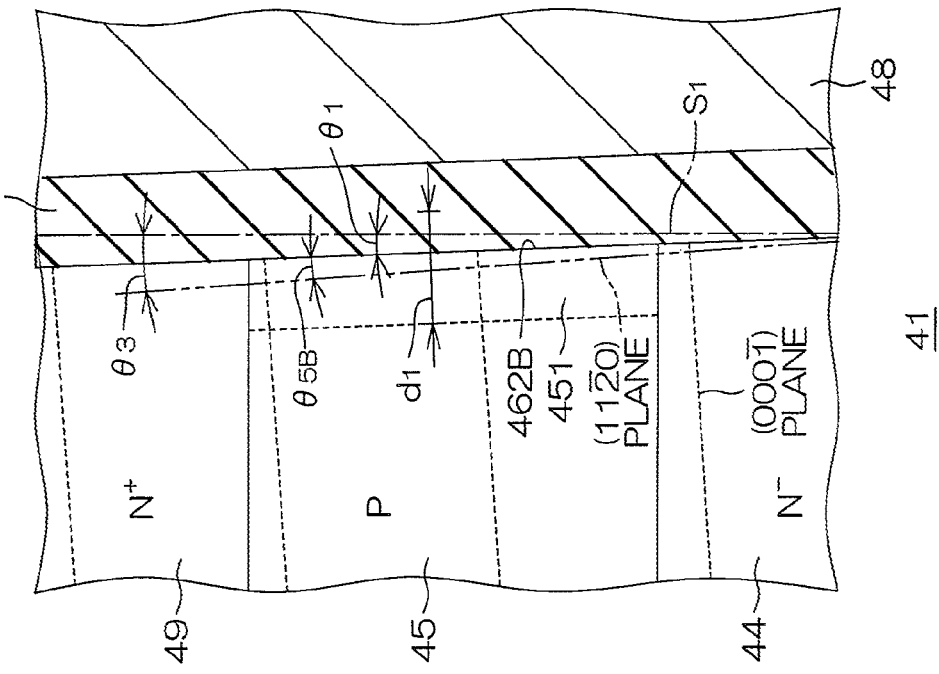
FIG. 11A is an enlarged view of a main part of one side surface of a gate trench of the semiconductor device shown in FIG. 7.

In contrast, as shown in FIG. 11A and FIG. 11B, the virtual surface $S_1$ is a surface perpendicular to the surface 431 (i.e., off-plane inclined by off-angle $\theta_3$ with respect to the (000-1) plane) in the semiconductor device 41, and hence is inclined by off-angle $\theta_3$ with respect to the (11-20) plane. Therefore, inclination angle $\theta_{5A}$ with respect to the (11-20) plane of the side surface 462A that is one of the side surfaces 462A and 462B of the gate trench 46 is the sum (for example, less than 5° exceeding 1°) of off-angle $\theta_3$ of the SiC substrate 42 and taper angle $\theta_1$ of the gate trench 106 (see FIG. 11B). Inclination angle $\theta_{5B}$ with respect to the (11-20) plane of the other side surface 462A is a difference (less than 3° exceeding) 1° between off-angle $\theta_3$ of the SiC substrate 42 and taper angle $\theta_1$ of the gate trench 106 (see FIG. 11A).

Off-angle $\theta_3$<off-angle $\theta_7$, and therefore the positional relationship between the side surfaces 462A and 462B of the gate trench and the (11-20) plane can be brought close to a more parallel relationship in the semiconductor device 41 than in the semiconductor device 101 including the SiC substrate 102 having an off-angle of more than 4°. In other words, in the semiconductor device 41, a channel is formed in the region 451 near an interface between the side surfaces 462A and 462B and the gate insulating film 47 in the body region 45, and electrons flow along the side surfaces 462A and 462B. These side surfaces 462A and 462B can be brought close to the (11-20) plane that is expected to achieve high mobility, and therefore channel mobility can be improved. Additionally, an appropriate impurity concentration (carrier concentration, e.g., $1\times10^{15}$ $cm^{-3}$ to $1\times10^{17}$ $cm^{-3}$) of the drain region 44 of the epitaxial layer 43 can be maintained.

If off-angle $\theta_3$ of the SiC substrate 42 is 0.3° or more and less than 4°, the application of a voltage to the gate electrode 48 makes it possible to fix an electric current (drain current) flowing through a channel formed in the body region 45 and a voltage (gate threshold voltage) produced when a drain current begins to flow at substantially constant magnitudes, respectively, in all plane orientations without causing variations by the plane orientation of the side surfaces 462A and 462B of the gate trench 46. Additionally, the flatness of the surface 431 of the epitaxial layer 43 can be maintained.

Additionally, the epitaxial layer 43 is formed on the side of the (000-1) plane (C plane) of the SiC substrate 42, and therefore, when the semiconductor device 41 is produced, the oxidation of the bottom surface 461 and the side surfaces 462A and 462B of the gate trench 46 proceeds under the condition that the oxidation rate of the bottom surface 461 of the gate trench and the oxidation rate of the side surfaces 462A and 462B satisfy the relational expression: oxidation rate of the bottom surface 461/oxidation rate of the side surfaces 462A and 462B>1. As a result, the gate insulating film 47 in which the thickness $t_1$ of the bottom portion 471 is greater than the thickness $t_2$ of the side portion 472 can be formed. Therefore, the dielectric breakdown of the bottom portion 471 of the gate insulating film 47 can be prevented, and withstand voltage can be improved by appropriately designing the thickness of the bottom portion 471 of the gate insulating film 47.

Additionally, P-type Poly-SiC whose Fermi level $Ef_{poly}$ (see FIG. 3A) is closer to the Fermi level of the body region 45 than the Fermi level of Si is employed as the material of the gate electrode 48. Accordingly, in the MOS (MIS) structure formed of the body region 45, the gate insulating film 47, and the gate electrode 48, like the relationship among the three elements, i.e., the relationship among the body region 3, the gate insulating film 6, and the gate electrode 7 shown in FIG. 3B, the bend of the energy band of the body region 45 in a state in which a voltage is not applied to the gate electrode 48 can be reduced in comparison with a case in which Si is employed as the material of the gate electrode 48. As a result, the threshold voltage of MOSFET of the semiconductor device 41 can be raised, and an off-leakage current can be reduced in comparison with a case in which Si is employed as the material of the gate electrode 48.

The body region 45 has a P-type impurity concentration of $1\times10^{18}$ cm$^{-3}$ or less (preferably, $7\times10^{17}$ cm$^{-3}$ to $9\times10^{17}$ cm$^{-3}$) in a region 451 whose depth $d_1$ from the center in the thickness direction of the side portion 472 of the gate insulating film 47 is 1000 Å or less. This region 451 is located near an interface with the gate insulating film 47 and the body region 45, and is a portion where a channel is formed when the semiconductor device 41 operates. Therefore, channel mobility can be much further improved by allowing the region 451 to have a low P-type impurity concentration of $1\times10^{18}$ cm$^{-3}$ or less.

FIG. 12 is a schematic sectional view of a semiconductor device according to a fifth embodiment of the present invention. In FIG. 12, the same reference numeral as in FIG. 7 is given to an element equivalent to each element of FIG. 7. When a structure shown in FIG. 12 is described, only differences between the structure of FIG. 7 and that of FIG. 12 are described, and the element to which the same reference numeral as in FIG. 7 is given is not described hereinafter.

In the semiconductor device 61 shown in FIG. 12, the gate electrode 62 formed on the gate insulating film 47 has a two-layer structure consisting of a first layer 63 that is formed along the inner surface of the gate trench 46 and that is contiguous to the gate insulating film 47 and a second layer 64 with which the inside of the first layer 63 is filled.

The first layer 63 is made of P-type Poly-SiC whose Fermi level is closer to the Fermi level of the body region than the Fermi level of Si.

The second layer 64 is made of a material different from that of the first layer 63. More specifically, the second layer 64 is made of P-type Poly-Si, or N-type Poly-Si, or a metal.

The same operation and effect as the semiconductor device 41 of FIG. 7 can be fulfilled by the structure of the semiconductor device 61.

Although the fourth and fifth embodiments of the present invention have been described as above, the present invention can be embodied in other forms.

For example, a structure in which the conductivity type of each semiconductor part of the semiconductor devices 41 and 61 is inverted may be employed. In more detail, in the semiconductor devices 41 and 61, the P-type part may be an N-type, and the N-type part may be a P-type.

Additionally, a structure in which the crystal planes of the front surface 421 and the back surface 422 of the SiC substrate 42 are inverted may be employed. In more detail, in the SiC substrate 42, the front surface 421 may be a Si plane, and the back surface 422 may be a C plane. In this case, a device is mounted on the Si plane (surface 421) of the SiC substrate 42.

Additionally, for example, materials whose Fermi level is closer to the Fermi level of the body region 45 than the Fermi level of Si can be widely employed as the material of the gate electrode 48 and the material of the first layer 63 without being limited to P-type Poly-SiC.

Preferably, materials whose band gap is wider than the band gap of Si are employed as the material of the gate electrode 48 and as the material of the first layer 63. Examples of materials suitable as the material of the gate electrode 48 and as the material of the first layer 63 include SiC doped with N-type impurities or P-type impurities, diamond doped with N-type impurities or P-type impurities, BN (boron nitride) doped with N-type impurities or P-type impurities, AlN (aluminum nitride) doped with N-type impurities or P-type impurities, GaN (gallium nitride) doped with N-type impurities or P-type impurities, GaAs (gallium arsenide) doped with N-type impurities or P-type impurities, GaP (gallium phosphide) doped with N-type impurities or P-type impurities, and ZnO (zinc oxide) doped with N-type impurities or P-type impurities.

SiC, diamond, BN, AlN, GaN, GaAs, GaP, and ZnO may be monocrystalline, or polycrystalline, or amorphous. If these materials are polycrystalline or amorphous, there is an advantage in the fact that their films can be more easily formed than monocrystalline materials.

B, Al, Ga (gallium), and In (indium) can be mentioned as P-type impurities with which SiC and diamond are doped.

N (nitrogen), P (phosphorus), As (arsenic), and Sb (antimony) can be mentioned as N-type impurities with which SiC and diamond are doped.

Be (beryllium), Mg (magnesium), Ca (calcium), and Sr (strontium) can be mentioned as P-type impurities with which BN, AlN, GaN, GaAs, GaP, and ZnO are doped.

C (carbon), Si, Ge (germanium), and Sn (tin) can be mentioned as N-type impurities with which BN, AlN, GaN, GaAs, GaP, and ZnO are doped.

EXAMPLES

Next, the present invention will be described based on examples and comparative examples. However, the present invention is not limited by these examples.

Examples 1 to 6 and Comparative Example 1

(1) Production of TEG (Test Element Group)

An epitaxial layer made of SiC was formed on the side of the C plane of a 4H—SiC substrate having an off-angle shown in Table 1 below, and then MOSFET (channel width=160 μm, channel length=0.4 μm) having a structure shown in FIG. 13 was formed in this epitaxial layer, and, as a result, TEGs were produced.

(2) Relationship Between Carrier Concentration and Off-Angle

Figure 14:
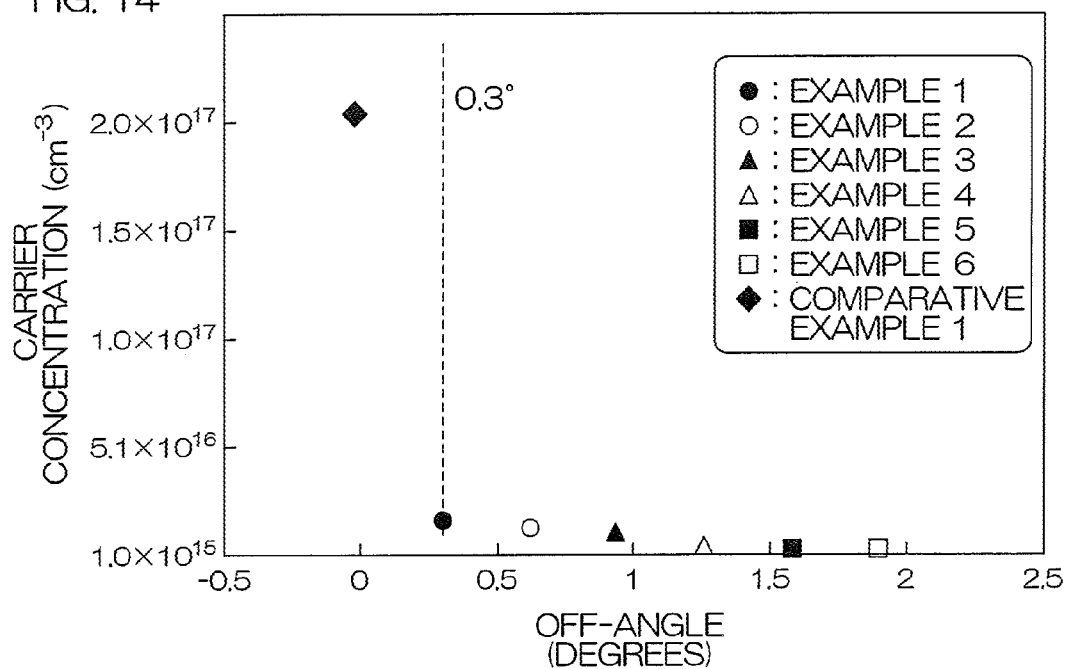
FIG. 14 is a graph showing a relationship between carrier concentration and an off-angle.

The carrier concentration of a drift region (drain region) in the epitaxial layer in each TEG mentioned above was measured. The results are shown in Table 1 and FIG. 14.

(3) Relationship Between Surface Roughness and Off-Angle of epitaxial layer

Root-mean-square roughness (RMS) of the surface of the epitaxial layer in each TEG was measured in conformity to JIS B0601. The results are shown in Table 1 and FIG. 15.

TABLE 1

|  | Off-angle | Carrier concentration ($cm^{-3}$) | RMS (nm) |
| --- | --- | --- | --- |
| Example 1 | 0.3 | $1.7 \times 10^{16}$ | 0.253 |
| Example 2 | 0.6 | $1.3 \times 10^{16}$ | 0.261 |
| Example 3 | 0.9 | $1.1 \times 10^{16}$ | 0.233 |
| Example 4 | 1.3 | $4.7 \times 10^{15}$ | 0.286 |
| Example 5 | 1.6 | $3.9 \times 10^{15}$ | 0.235 |
| Example 6 | 1.9 | $3.9 \times 10^{15}$ | 0.234 |
| Comparative Example 1 | 0 | $2.0 \times 10^{17}$ | 156 |

(4) Evaluation

Figure 15:
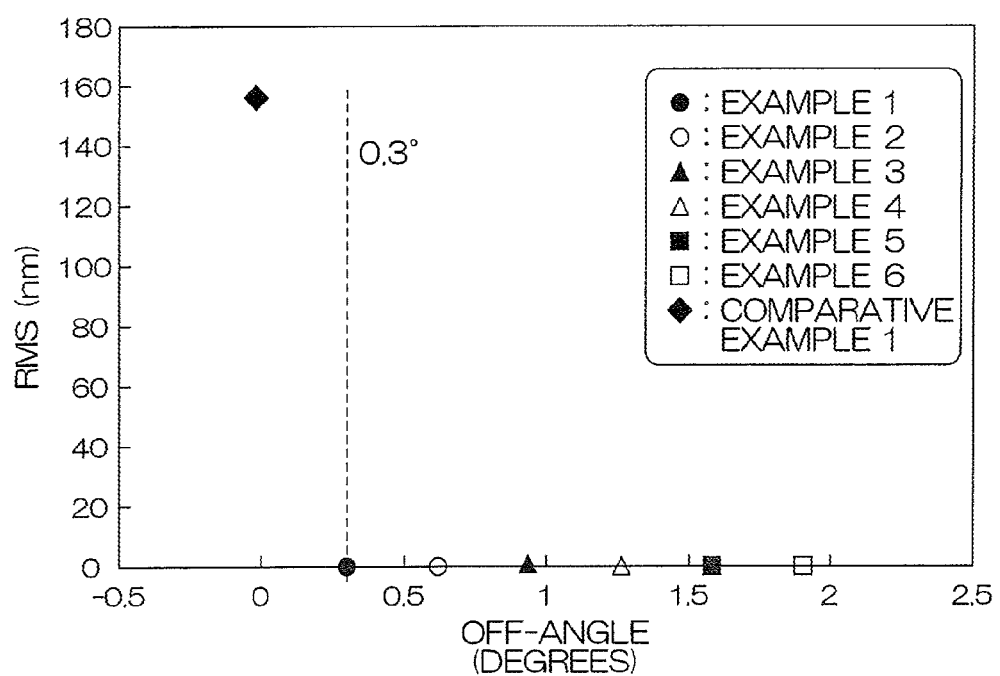
FIG. 15 is a graph showing a relationship between surface roughness of an epitaxial layer and an off-angle.

In Comparative Example 1, the carrier concentration of the drift region was excessive (Table 1 and FIG. 14), and the surface of the epitaxial layer was rough (Table 1 and FIG. 15). In contrast, in Examples 1 to 6, it was confirmed that the carrier concentration of the drift region is appropriate in amount (Table 1 and FIG. 14), and the flatness of the surface of the epitaxial layer is maintained (Table 1 and FIG. 15).

Example 7 and Comparative Example 2

(1) Processing of Test Substrate

Figure 16:
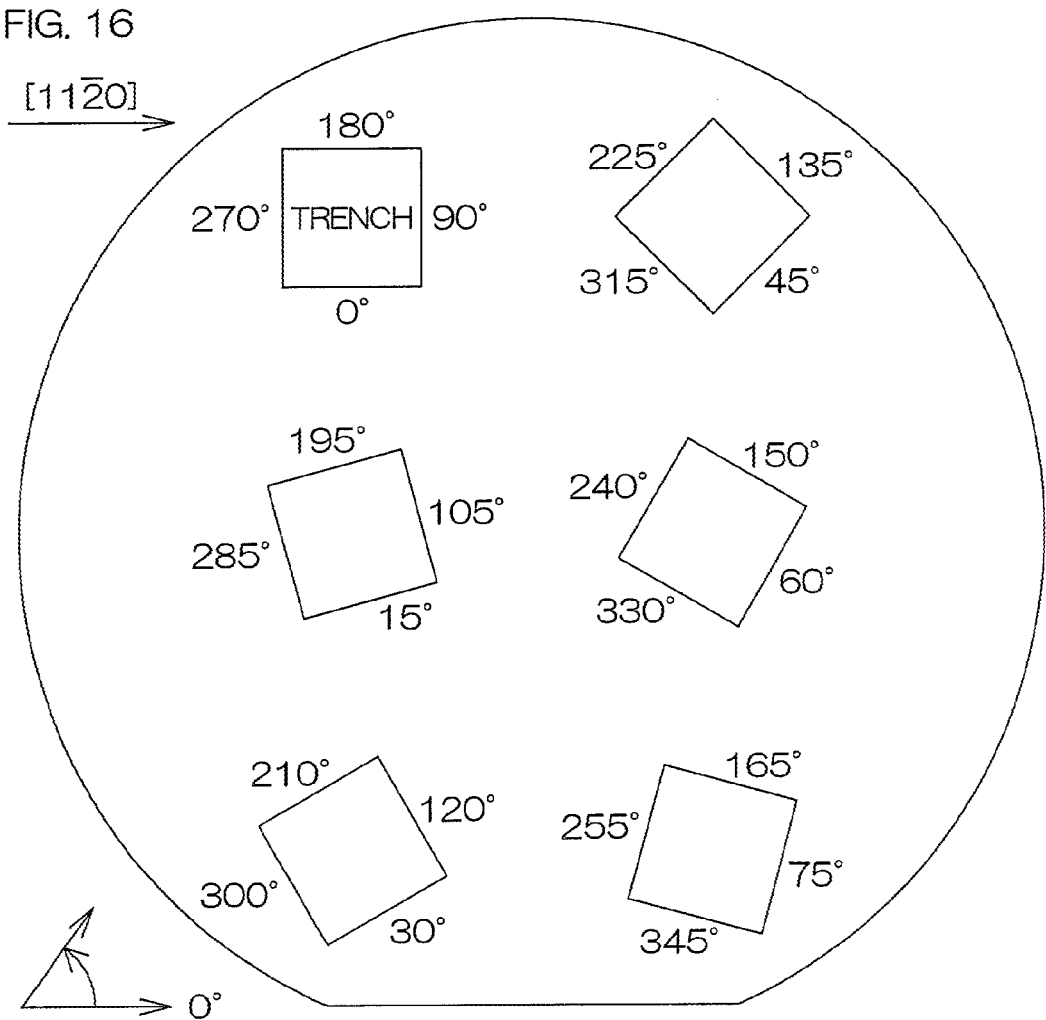
FIG. 16 is a schematic plan view of test wafers of Example 7 and Comparative Example 2.

An epitaxial layer made of SiC was formed on the side of the C plane of the 4H—SiC substrate having an off-angle of 1° (Example 7) and on the side of the Si plane of the 4H—SiC substrate having an off-angle of 4° (Comparative Example 2), and then a plurality of trench units each of which has a side surface inclined at a predetermined angle with respect to the direction of the [11-20] axis was formed as shown in FIG. 16. Each angle of FIG. 16 shows an inclination angle with respect to the [11-20] axis.

Figure 13:
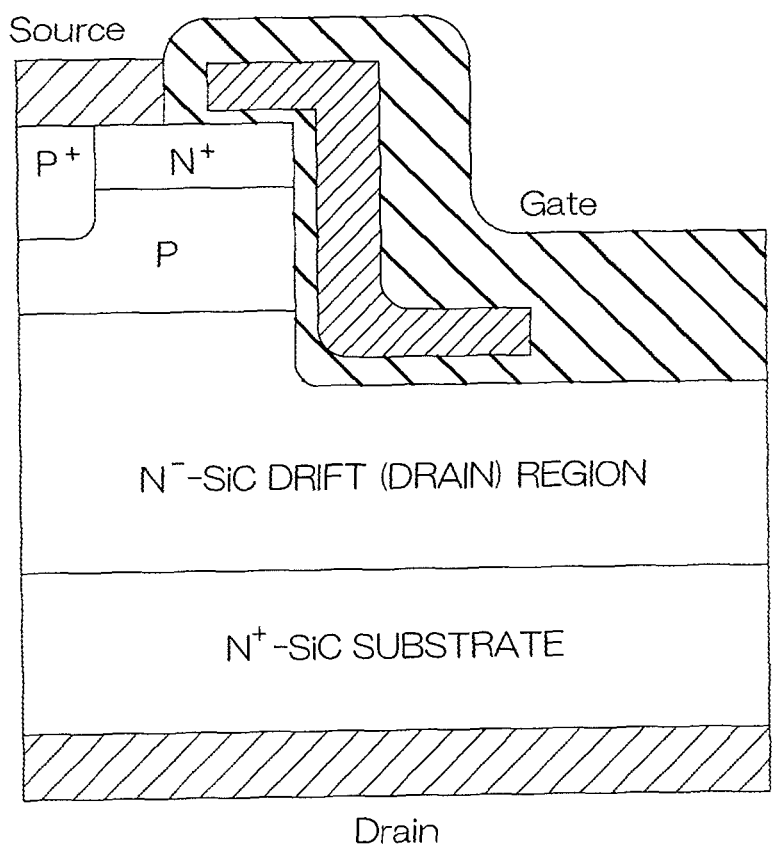
FIG. 13 is a schematic sectional view of MOSFET in an example and in a comparative example.

Thereafter, MOS FET having a structure shown in FIG. 13 was formed at each side surface of each trench unit.

(2) Plane Orientation Dependency of Drain Current ($I_{ds}$)

Figure 17B:
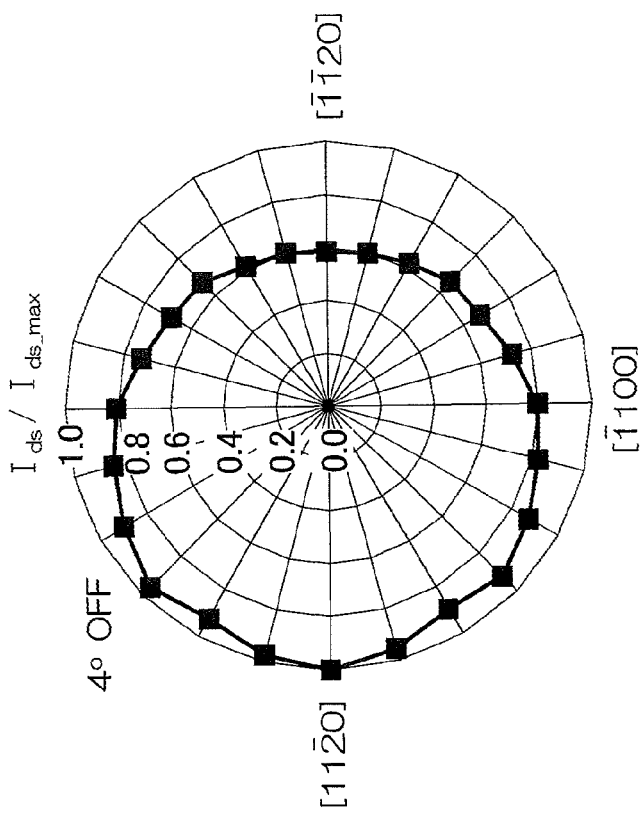
FIG. 17B is a view showing the magnitude of drain current $I_{ds}$ of Comparative Example 2.
Figure 17A:
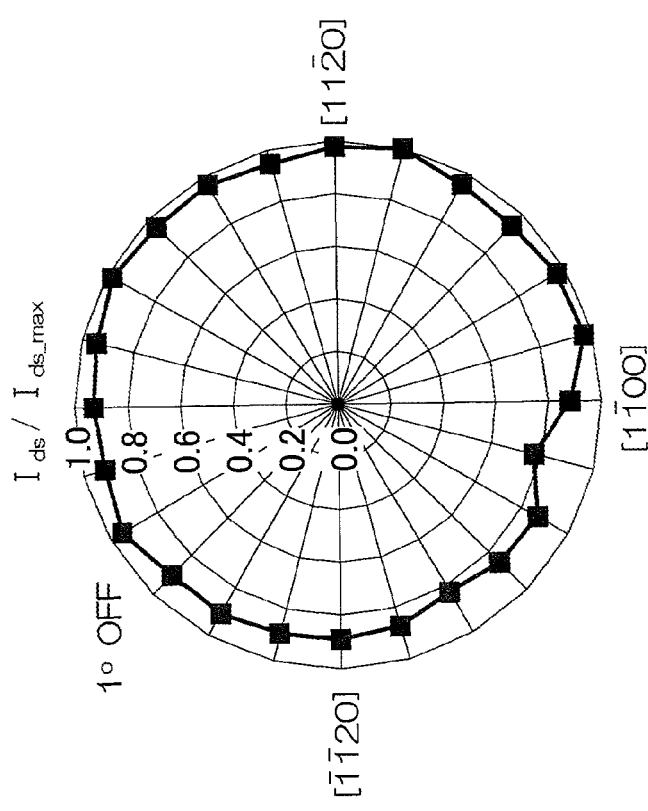
FIG. 17A is a view showing the magnitude of drain current $I_{ds}$ of Example 7.

A drain current $I_{ds}$ generated when a voltage of 20 V was applied to the gate electrode of each MOSFET mentioned above was measured. The results are shown in FIG. 17A and FIG. 17B. In FIG. 17A and FIG. 17B, the drain current $I_{ds}$ of each MOSFET is shown by being standardized ($I_{ds}/I_{ds\_max}$) by the maximum drain current $I_{ds}$.

(3) Plane Orientation Dependency of Gate Threshold Voltage ($V_{th}$)

Figure 18A:
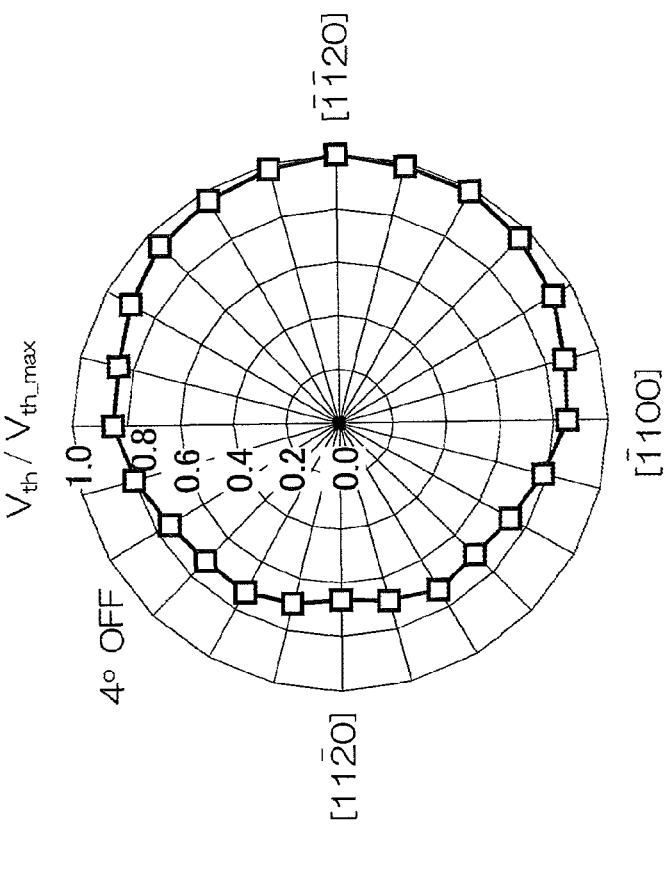
FIG. 18A is a view showing the magnitude of gate threshold voltage $V_{th}$ of Example 7.
Figure 18B:
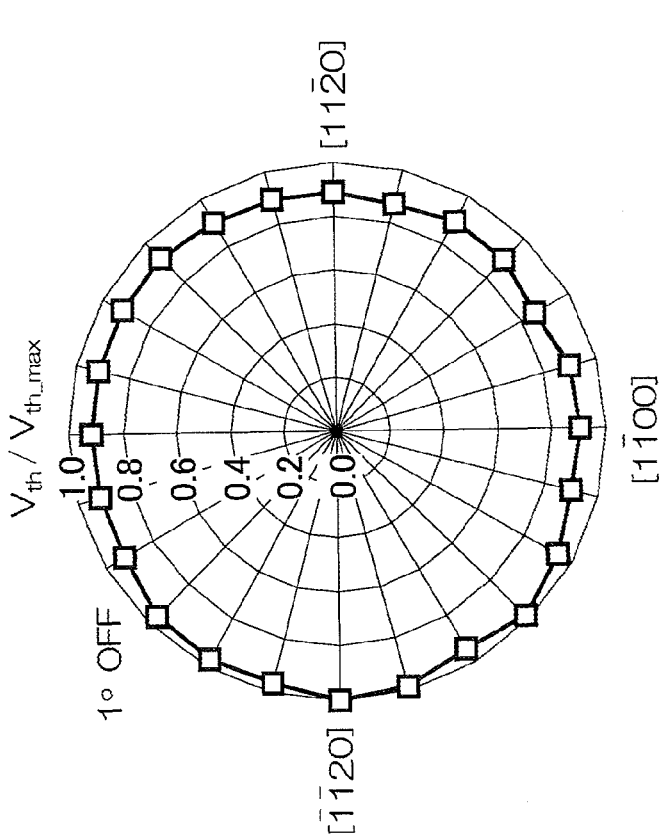
FIG. 18B is a view showing the magnitude of gate threshold voltage $V_{th}$ of Comparative Example 2.
Figure 19:
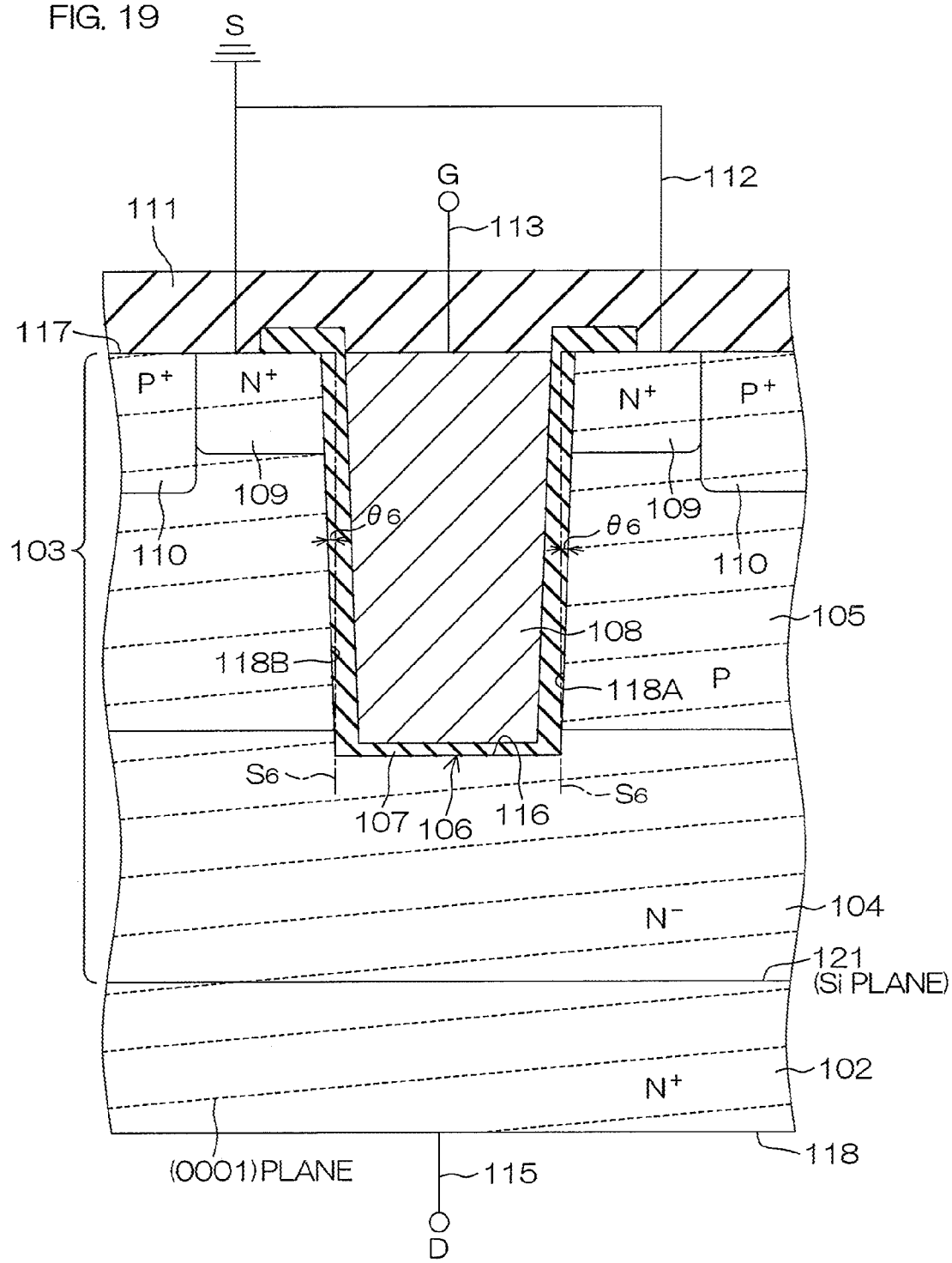
FIG. 19 is a schematic sectional view of a conventional SiC semiconductor device.
Figure 20A:
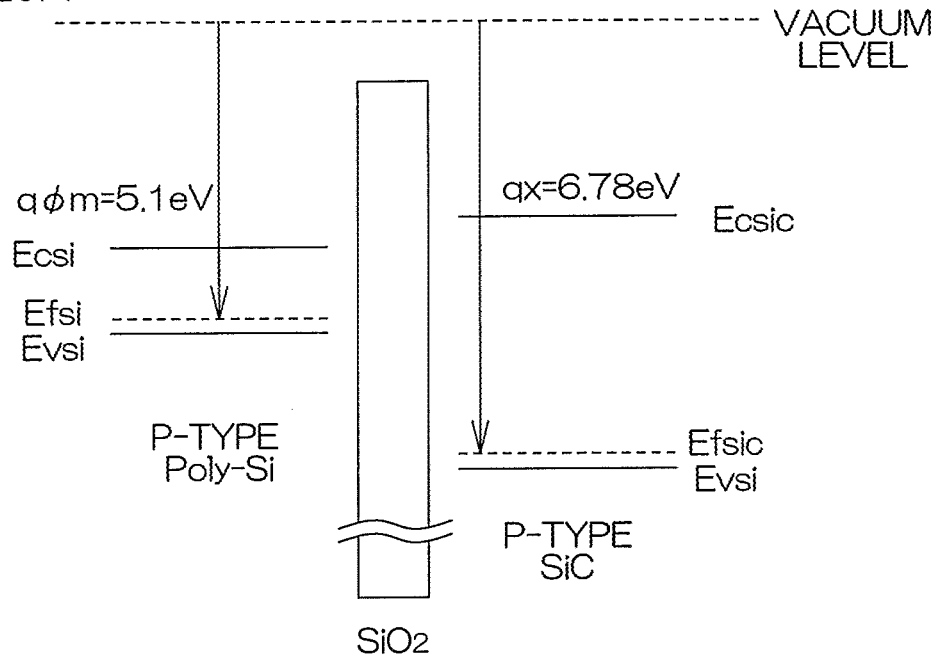
FIG. 20A is an energy band view of P-type Poly-Si and P-type SiC.
Figure 20B:
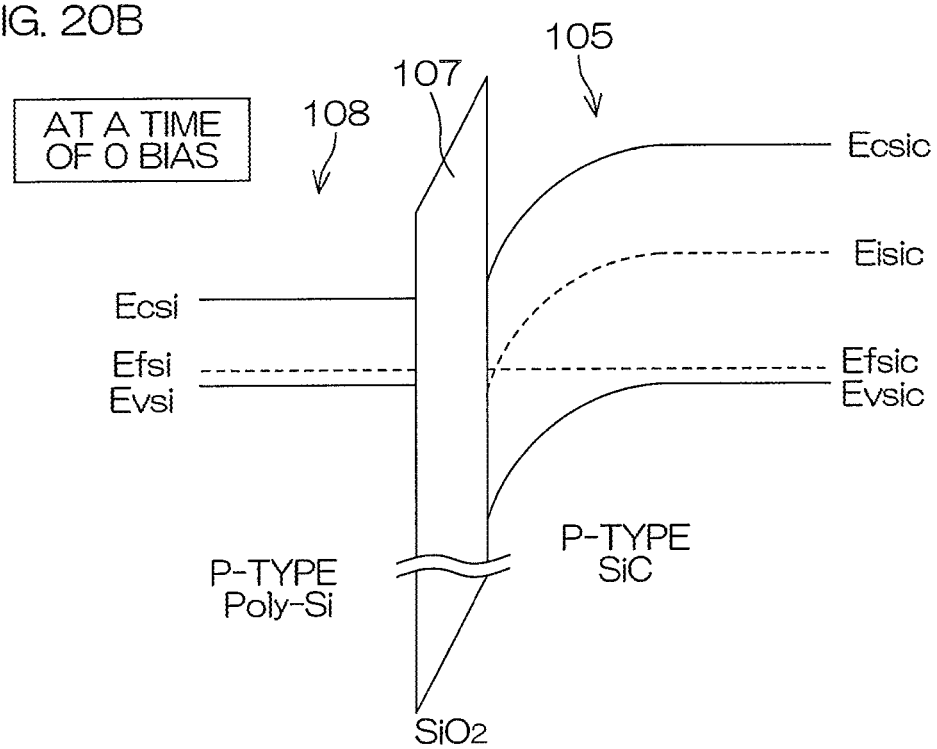
FIG. 20B is an energy band view when P-type Poly-Si and P-type SiC are joined together with $SiO_2$ placed therebetween.
Figure 21:
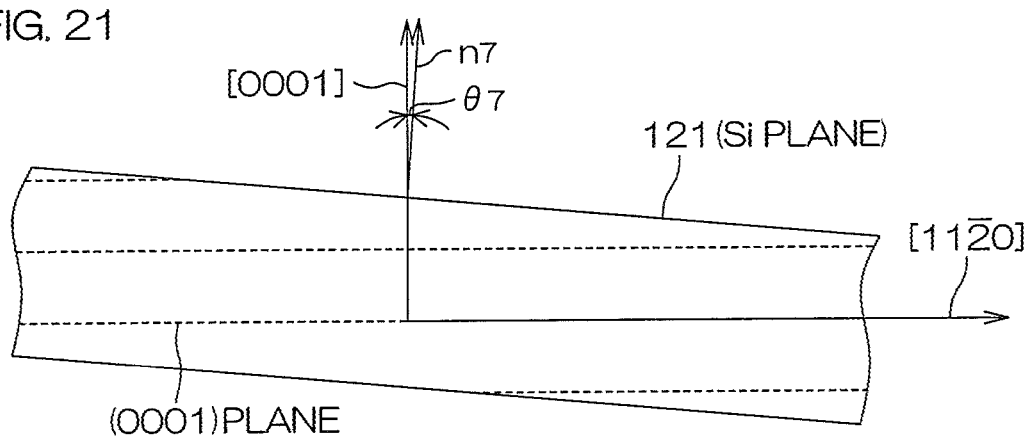
FIG. 21 is a view for explaining an off-angle of a SiC monocrystalline substrate shown in FIG. 19.

A gate threshold voltage $V_{th}$ generated when a drain current $I_{ds}$ began to flow to each MOSFET mentioned above was measured. The results are shown in FIG. 18A and FIG. 18B. In FIG. 18A and FIG. 18B, the gate threshold voltage $V_{th}$ of each MOSFET is shown by being standardized ($V_{th}/V_{th\_max}$) by the maximum gate threshold voltage $V_{th}$.

(4) Evaluation

As shown in FIG. 17B and FIG. 18B, in Comparative Example 2, the drain current $I_{ds}$ and the gate threshold voltage $V_{th}$ were greatly changed in magnitude depending on the plane orientation of the trench side surface, and variations occurred. In contrast, as shown in FIG. 17A and FIG. 18A, in Example 7, it was confirmed that the drain current $I_{ds}$ and the gate threshold voltage $V_{th}$ are substantially constant (uniform) in magnitude in all plane orientations of the trench side surface.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2009-170154 filed with the Japan Patent Office on Jul. 21, 2009, Japanese Patent Application No. 2009-233777 filed with the Japan Patent Office on Oct. 7, 2009 and Japanese Patent Application No. 2010-152085 filed with the Japan Patent Office on Jul. 2, 2010, the disclosures of which are incorporated herein by reference.

What is claimed is:

1. A semiconductor device comprising:
   a SiC substrate;
   an epitaxial layer formed on a side of one surface of the SiC substrate; and
   a gate trench dug downwardly from a principal plane of the epitaxial layer, wherein
   an off-angle of the SiC substrate exceeds 0° and is less than 4°, and
   a bottom surface of the gate trench is a surface inclined by the off-angle with respect to a just (000-1) plane.

2. The semiconductor device according to claim 1, wherein one surface of the SiC substrate is a C plane.

3. The semiconductor device according to claim 1, wherein the off-angle of the SiC substrate is 0.3° or more and less than 4°.

4. The semiconductor device according to claim 1, wherein the off-angle of the SiC substrate is 1°.

5. The semiconductor device according to claim 1, further comprising a gate insulating film formed on a bottom surface and side surfaces of the gate trench, wherein
   a thickness of a portion on the bottom surface in the gate insulating film is greater than a thickness of a portion on the side surface in the gate insulating film.

6. The semiconductor device according to claim 1, wherein the gate trench is tapered.

7. The semiconductor device according to claim 1, wherein
   the epitaxial layer contains a body region formed beside the gate trench,
   a gate electrode facing the body region via a gate insulating film formed on a side surface of the gate trench is formed at the gate trench, and the gate electrode is formed by use of a same material as the body region.

8. The semiconductor device according to claim 7, wherein a material of the body region is P-type SiC, and a material of the gate electrode is P-type Poly-SiC.

9. The semiconductor device according to claim 7, wherein a material of the body region is P-type SiC, and the gate electrode has a layered structure consisting of a first layer that is contiguous to the gate insulating film and made of P-type Poly-SiC and a second layer that is stacked on the first layer and made of P-type Poly-Si.

10. The semiconductor device according to claim 7, wherein the body region has an impurity concentration of $1\times10^{18}$ cm$^{-3}$ or less in a portion whose depth from the gate insulating film is 1000 Å or less.

11. The semiconductor device according to claim 1, further comprising:

a semiconductor region made of a material to which conductive impurities are added, the semiconductor region formed on an inner surface of the gate trench; and a gate electrode facing the semiconductor region via an insulating film, wherein the gate electrode comprises an electroconductive first layer that is contiguous to the insulating film and that is made of a material whose Fermi level is closer to a Fermi level of the semiconductor region than a Fermi level of Si, and an electroconductive second layer that is stacked on the first layer and that is made of a material different from the material of the first layer.

12. The semiconductor device according to claim 11, wherein the first layer is P-type Poly-SiC, and the second layer is P-type Poly-Si, and the P-type impurity is B (boron).

13. The semiconductor device according to claim 1, further comprising:

a semiconductor region made of a material to which conductive impurities are added, the semiconductor region formed on an inner surface of the gate trench; and an insulating film formed on a surface of the semiconductor region, wherein the semiconductor region has an impurity concentration of $1\times10^{18}$ cm$^{-3}$ or less in a portion whose depth from the insulating film is 1000 Å or less.

14. The semiconductor device according to claim 1, further comprising an insulating film formed on an inner surface of the gate trench, wherein the insulating film includes a first portion on the bottom surface of the gate trench and a second portion on the side surface of the gate trench, and the first portion is thicker than the second portion.

15. The semiconductor device according to claim 1, wherein the bottom surface of the gate trench is a surface inclined by the off-angle in a direction of a [11-20] axis with respect to a just (000-1) plane.

* * * * *